(12) United States Patent
Muyari et al.

(10) Patent No.: US 9,318,401 B2
(45) Date of Patent: *Apr. 19, 2016

(54) GLASS COMPOSITION FOR PROTECTING SEMICONDUCTOR JUNCTION, METHOD OF MANUFACTURING SEMICONDUCTOR DEVICE AND SEMICONDUCTOR DEVICE

(75) Inventors: Koya Muyari, Hanno (JP); Koji Ito, Hanno (JP); Atsushi Ogasawara, Hanno (JP); Kazuhiko Ito, Hanno (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/369,732

(22) PCT Filed: May 8, 2012

(86) PCT No.: PCT/JP2012/061777
§ 371 (c)(1),
(2), (4) Date: Jun. 30, 2014

(87) PCT Pub. No.: WO2013/168237
PCT Pub. Date: Nov. 14, 2013

(65) Prior Publication Data
US 2014/0353851 A1 Dec. 4, 2014

(51) Int. Cl.
*C03C 3/076* (2006.01)
*B32B 17/00* (2006.01)
*H01L 21/00* (2006.01)
*H01L 23/29* (2006.01)
*H01L 29/66* (2006.01)
(Continued)

(52) U.S. Cl.
CPC .............. *H01L 23/291* (2013.01); *C03C 3/093* (2013.01); *C03C 8/04* (2013.01);
(Continued)

(58) Field of Classification Search
None
See application file for complete search history.

(56) References Cited

U.S. PATENT DOCUMENTS

| 4,217,689 A | 8/1980 | Fujii et al. |
| 5,047,369 A * | 9/1991 | Fleming ............ H01L 21/02129 148/DIG. 133 |

(Continued)

FOREIGN PATENT DOCUMENTS

| CN | 103403846 A | 11/2013 |
| JP | 5336463 A | 4/1978 |

(Continued)

OTHER PUBLICATIONS

Fluegel, Alexander., "Thermal Expansion Calculation for Silicate Glasses at 210 C Based on a Systematic Analysis of Global Databases." Glass Technology, v. 51, No. 5 (Oct. 2010), pp. 191-201, ill. 1753-3546.*

(Continued)

*Primary Examiner* — Calvin Choi
*Assistant Examiner* — Xiaoming Liu
(74) *Attorney, Agent, or Firm* — Hauptman Ham, LLP

(57) ABSTRACT

Provided is a glass composition for protecting a semiconductor junction which contains at least $SiO_2$, $B_2O_3$, $Al_2O_3$, ZnO and at least two oxides of alkaline earth metals selected from a group consisting of CaO, MgO and BaO, and substantially contains none of Pb, As, Sb, Li, Na and K, wherein an average linear expansion coefficient within a temperature range of 50° C. to 550° C. falls within a range of $3.33 \times 10^{-6}$ to $4.13 \times 10^{-6}$. A semiconductor device having high breakdown strength can be manufactured using such a glass material containing no lead in the same manner as a conventional case where "a glass material containing lead silicate as a main component" is used.

20 Claims, 14 Drawing Sheets

(51) Int. Cl.
*H01L 29/861* (2006.01)
*H01L 21/02* (2006.01)
*H01L 21/762* (2006.01)
*C03C 8/04* (2006.01)
*H01L 21/56* (2006.01)
*C03C 3/093* (2006.01)
*H01L 23/31* (2006.01)

(52) U.S. Cl.
CPC ... *H01L 21/02112* (2013.01); *H01L 21/02164* (2013.01); *H01L 21/02178* (2013.01); *H01L 21/02192* (2013.01); *H01L 21/02345* (2013.01); *H01L 21/56* (2013.01); *H01L 21/76232* (2013.01); *H01L 29/66136* (2013.01); *H01L 29/8611* (2013.01); *H01L 29/8613* (2013.01); *C03C 2207/00* (2013.01); *H01L 23/3171* (2013.01); *H01L 2924/0002* (2013.01)

(56) References Cited

U.S. PATENT DOCUMENTS 5,298,330 A * 3/1994 Stadnicar et al. ............ 428/432
2002/0023674 A1 2/2002 Sugawara et al.
2006/0175083 A1 8/2006 Muramatsu et al.
2006/0181828 A1* 8/2006 Sato .................. H01L 27/15 361/91.1
2008/0223607 A1 9/2008 Muramatsu et al.
2009/0109654 A1* 4/2009 Fechner .............. C03C 3/068 362/97.1
2013/0105797 A1* 5/2013 Hayashi et al. ................ 257/57
2014/0339685 A1 11/2014 Muyari et al.

FOREIGN PATENT DOCUMENTS

| JP | 10294473 A | * 11/1998 |
| JP | 200216272 A | 1/2002 |
| JP | 200487955 A | 3/2004 |
| JP | 2006253669 A | 9/2006 |

OTHER PUBLICATIONS

International Search Report mailed Aug. 21, 2012, corresponds to PCT/JP2012/061777.

Extended European Search Report dated Oct. 21, 2015, corresponding to European Patent Application No. 12876275.4.

* cited by examiner

FIG.9

| item | | | example 1 | example 2 | example 3 | example 4 | example 5 | example 6 | example 7 | example 8 | comparison example 1 | comparison example 2 |
|---|---|---|---|---|---|---|---|---|---|---|---|---|
| composition ratio (mol ratio) | SiO$_2$ | | 61.3 | 52.5 | 57.1 | 58.3 | 58.3 | 58.3 | 58.8 | 55.4 | 75.0 | 12.0 |
| | B$_2$O$_3$ | | 8.8 | 17.5 | 13.9 | 11.7 | 11.7 | 11.7 | 13.7 | 13.8 | 0.0 | 29.0 |
| | Al$_2$O$_3$ | | 14.0 | 14.0 | 14.1 | 12.0 | 14.0 | 14.0 | 8.8 | 4.5 | 5.0 | 0.0 |
| | ZnO | | 8.0 | 8.0 | 4.6 | 9.0 | 8.0 | 8.0 | 7.8 | 13.5 | 0.0 | 58.0 |
| | alkaline earth metal | CaO | 2.4 | 2.4 | 6.1 | 2.7 | 2.4 | 4.0 | 4.9 | 7.3 | 0 | 0 |
| | | MgO | 0 | 2.2 | 0 | 1.3 | 1.1 | 0 | 2.0 | 0 | 0 | 0 |
| | | BaO | 5.8 | 3.4 | 4.1 | 5.0 | 4.5 | 4.0 | 2.9 | 5.0 | 0 | 0 |
| | NiO | | 0 | 0 | 0 | 0 | 0 | 0 | 0 | 0.6 | 0 | 0 |
| | ZrO$_2$ | | 0 | 0 | 0 | 0 | 0 | 0 | 1.0 | 0 | 0 | 0 |
| | PbO | | 0 | 0 | 0 | 0 | 0 | 0 | 0 | 0 | 20.0 | 0 |
| | others | | 0 | 0 | 0 | 0 | 0 | 0 | 0 | 0 | 0 | 1.0 |
| | total | | 100 | 100 | 100 | 100 | 100 | 100 | 100 | 100 | 100 | 99 |
| presence or non-presence of insulation layer | | | present | present | present | present | present | present | not present | not present | not present | not present |
| evaluation item | evaluation item 1 (environmental burden) | | good | good | good | good | good | good | good | good | bad | good |
| | evaluation item 2 (baking temperature) | | good | good | good | good | good | good | good | good | good | good |
| | evaluation item 3 (resistance against chemicals) | | good | good | good | good | good | good | good | good | good | bad |
| | evaluation item 4 (average linear expansion coefficient) | | good (3.82) | good (3.78) | good (3.75) | good (3.65) | good (3.52) | good (3.41) | good (3.90) | good (3.97) | bad (4.16) | bad (4.18) |
| | evaluation item 5 (insulation property) | | good | good | good | good | good | good | good | good | good | good |
| | evaluation item 6 (presence or non-presence of crystallization) | | good | good | good | good | good | good | good | good | good | good |
| | evaluation item 7 (presence or non-presence of generation of bubbles) | | good | good | good | good | good | good | good | good | bad | good |
| comprehensive evaluation | | | good | good | good | good | good | good | good | good | bad | bad |

| | L1 | L2 | L3 | L4 | L5 | L5 | L6 | L7 | L8 |
|---|---|---|---|---|---|---|---|---|---|
| SiO$_2$ | 37.50 | 37.50 | 37.50 | 41.70 | 41.70 | 41.70 | 43.70 | 43.70 | 43.70 |
| B$_2$O$_3$ | 12.50 | 12.50 | 12.50 | 8.30 | 8.30 | 8.30 | 6.30 | 6.30 | 6.30 |
| Al$_2$O$_3$ | 10.00 | 12.00 | 14.00 | 10.00 | 12.00 | 14.00 | 10.00 | 12.00 | 14.00 |
| ZnO | 12.00 | 19.00 | 25.20 | 12.00 | 19.00 | 25.20 | 20.00 | 26.60 | 10.80 |
| CaO | 8.40 | 9.50 | 7.56 | 14.00 | 13.30 | 3.24 | 14.00 | 3.42 | 12.60 |
| MgO | 7.84 | 1.90 | -- | -- | 2.28 | 1.51 | 1.20 | -- | 5.04 |
| BaO | 11.76 | 7.60 | 3.24 | 14.00 | 3.42 | 6.05 | 4.80 | 7.98 | 7.56 |
| SUM | 100 | 100 | 100 | 100 | 100 | 100 | 100 | 100 | 100 |
| total RO | 28.00 | 19.00 | 10.80 | 28.00 | 19.00 | 10.80 | 20.00 | 11.40 | 25.20 |
| crystallization | good | good | good | good | good | good | good | good | good |
| α (50–550) [ppm] | 6.70 | 5.97 | 4.74 | 7.22 | 5.88 | 5.17 | 5.79 | 4.98 | 6.09 |
| Tg[°C] | 647.9 | 632.0 | 650.6 | 666.7 | 666.0 | 665.2 | 668.2 | 671.7 | 691.9 |
| Ts[°C] | 719.6 | 707.4 | 717.4 | 730.8 | 742.5 | 732.0 | 724.8 | 742.6 | 764.4 |

| | L10 | L11 | L12 | L13 | L14 | L15 | L16 | L17 | L18 |
|---|---|---|---|---|---|---|---|---|---|
| SiO$_2$ | 52.50 | 52.50 | 52.50 | 58.30 | 58.30 | 58.30 | 61.25 | 61.25 | 61.25 |
| B$_2$O$_3$ | 17.50 | 17.50 | 17.50 | 11.70 | 11.70 | 11.70 | 8.75 | 8.75 | 8.75 |
| Al$_2$O$_3$ | 10.00 | 12.00 | 14.00 | 10.00 | 12.00 | 14.00 | 10.00 | 12.00 | 14.00 |
| ZnO | 14.00 | 5.40 | 8.00 | 10.00 | 12.60 | 4.80 | 14.00 | 5.40 | 8.00 |
| CaO | 3.00 | 8.82 | 2.40 | 3.00 | 2.70 | 7.84 | 4.20 | 3.78 | 4.00 |
| MgO | 0.60 | -- | 2.24 | -- | 1.08 | 0.67 | 0.72 | 1.76 | 0.00 |
| BaO | 2.40 | 3.78 | 3.36 | 7.00 | 1.62 | 2.69 | 1.08 | 7.06 | 4.00 |
| SUM | 100 | 100 | 100 | 100 | 100 | 100 | 100 | 100 | 100 |
| total RO | 6.00 | 12.60 | 8.00 | 10.00 | 5.40 | 11.20 | 6.00 | 12.60 | 8.00 |
| crystallization | bad | good | good | good | bad | good | bad | good | good |
| α (50–550) [ppm] | 3.85 | 4.68 | 3.78 | 4.42 | 3.47 | 4.12 | 3.16 | 4.51 | 3.41 |
| Tg[°C] | 649.1 | 673.9 | 686.4 | 674.7 | 689.9 | 725.1 | 692.3 | 717.5 | 703.0 |
| Ts[°C] | 740.3 | 757.5 | 774.6 | 762.5 | 824.6 | 815.0 | 865.8 | 810.8 | 791.8 |

FIG.13

GLASS COMPOSITION FOR PROTECTING SEMICONDUCTOR JUNCTION, METHOD OF MANUFACTURING SEMICONDUCTOR DEVICE AND SEMICONDUCTOR DEVICE

RELATED APPLICATIONS

The present application is a National Phase of International Application Number PCT/JP2012/061777, filed May 8, 2012.

TECHNICAL FIELD

The present invention relates to a glass composition for protecting a semiconductor junction, a method of manufacturing a semiconductor device and such a semiconductor device.

BACKGROUND ART

There has been known a method of manufacturing a semiconductor device where a glass layer for passivation is formed such that the glass layer covers a pn junction exposure portion in the process of manufacturing a mesa-type semiconductor device (see patent literature 1, for example).

FIG. 14A to FIG. 14D and FIG. 15A to FIG. 15D are views for explaining such a conventional method of manufacturing a semiconductor device. FIG. 14A to FIG. 14D and FIG. 15A to FIG. 15D are views showing respective steps of the conventional method.

The conventional method of manufacturing a semiconductor device includes, as shown in FIG. 14A to FIG. 14D and FIG. 15A to FIG. 15D, "semiconductor base body forming step", "trench forming step", "glass layer forming step", "photoresist forming step", "oxide film removing step", "roughened surface region forming step", "electrode forming step", and "semiconductor base body cutting step" in this order. Hereinafter, the conventional method of manufacturing a semiconductor device is explained in the order of these steps.

(a) Semiconductor Base Body Forming Step

Firstly, a $p^+$ type diffusion layer 912 is formed by diffusion of a p type impurity from one surface of an $n^-$ type semiconductor substrate ($n^-$ type silicon substrate) 910, and an $n^+$ type diffusion layer 914 is formed by diffusion of an n type impurity from the other surface of the $n^-$ type semiconductor substrate 910 thus forming a semiconductor base body in which a pn junction arranged parallel to a main surface of the semiconductor base body is formed. Thereafter, oxide films 916, 918 are formed by thermal oxidation on a surface of the $p^+$ type diffusion layer 912 and a surface of the $n^+$ type diffusion layer 914 respectively (see FIG. 14A).

(b) Trench Forming Step

Next, predetermined opening portions are formed on the oxide film 916 at predetermined positions by photo etching. After etching the oxide film, subsequently, the semiconductor base body is etched thus forming trenches 920 having a depth exceeding the pn junction from one surface of the semiconductor base body (see FIG. 14B).

(c) Glass Layer Forming Step

Next, a layer made of the glass composition for protecting a semiconductor junction is formed on inner surfaces of the trenches 920 and a surface of the semiconductor base body in the vicinity of the trenches 920 by an electrophoresis method, and the layer made of the glass composition for protecting a semiconductor junction is baked so that a glass layer 924 for passivation is formed on surfaces of the trenches 920 (see FIG. 14C).

(d) Photoresist Forming Step

Next, a photoresist 926 is formed such that the photoresist 926 covers a surface of the glass layer 924 (see FIG. 14D).

(e) Oxide Film Removing Step

Next, the oxide film 916 is etched using the photoresist 926 as a mask so that the oxide films 916, 918 in a portion 930 where an Ni plating electrode film is formed are removed (see FIG. 15A).

(f) Roughened Surface Region Forming Step

Next, surface roughening treatment is applied to a surface of the semiconductor base body in the portion 930 where the Ni plating electrode film is formed thus forming a roughened surface region 932 for increasing adhesion between the Ni plating electrode and the semiconductor base body (see FIG. 15B).

(g) Electrode Forming Step

Next, an Ni plating is applied to the semiconductor base body thus forming an anode electrode 934 on the roughened surface region 932, and forming a cathode electrode 936 on the other surface of the semiconductor base body (see FIG. 15C).

(h) Semiconductor Base Body Cutting Step

Next, the semiconductor base body is cut by dicing or the like at a center portion of the glass layer 924 thus dividing the semiconductor base body into a plurality of chips whereby mesa-type semiconductor devices (pn diodes) 900 are formed (see FIG. 15D).

As has been explained heretofore, the conventional method of manufacturing a semiconductor device includes the step of forming the trenches 920 exceeding the pn junction from one surface of the semiconductor base body where the pn junction arranged parallel to the main surface is formed (see FIG. 14A and FIG. 14B), and the step of forming the glass layer 924 for passivation in the inside of the trench 920 such that the glass layer 924 covers a pn junction exposure portion (see FIG. 14C). Accordingly, in the conventional method of manufacturing a semiconductor device, by cutting the semiconductor base body after forming the glass layer 924 for passivation in the inside of the trench 920, mesa-type semiconductor devices having high breakdown strength can be manufactured.

PRIOR ART LITERATURE

Patent Literature

Patent literature 1 JP-A-2004-87955

SUMMARY OF THE INVENTION

Technical Problem

A glass material which is used for forming a glass layer for passivation is required to satisfy following conditions (a) to (d), that is, the condition (a) that the glass material can be baked at a proper temperature, the condition (b) that the glass material withstands chemicals used in steps, the condition (c) that the glass material has a linear expansion coefficient close to a linear expansion coefficient of silicon for preventing warping of a wafer during steps (particularly an average linear expansion coefficient at a temperature of 50° C. to 550° C. being close to a linear expansion coefficient of silicon), and the condition (d) that the glass material has excellent insulation property. In view of the above, "a glass material containing lead silicate as a main component" has been widely used conventionally.

However, "the glass material containing lead silicate as a main component" contains lead which imposes a heavy burden on an environment and hence, it is thought that the use of "the glass material containing lead silicate as a main component" will be prohibited in the near future.

The present invention has been made in view of such circumstances, and it is an object of the present invention to provide a glass composition for protecting a semiconductor junction, a method of manufacturing a semiconductor device and such a semiconductor device which can manufacture a semiconductor device having high breakdown strength using a glass material containing no lead in the same manner as a conventional case where "a glass material containing lead silicate as a main component" is used.

Solution to Problem

[1] According to one aspect of the present invention, there is provided a glass composition for protecting a semiconductor junction which contains at least $SiO_2$, $B_2O_3$, $Al_2O_3$, ZnO and at least two oxides of alkaline earth metals selected from a group consisting of CaO, MgO and BaO, and substantially contains none of Pb, As, Sb, Li, Na and K, wherein an average linear expansion coefficient within a temperature range of 50° C. to 550° C. falls within a range of $3.33 \times 10^{-6}$ to $4.13 \times 10^{-6}$.

[2] In the above-mentioned glass composition for protecting a semiconductor junction according to the present invention, it is preferable that an average linear expansion coefficient within a temperature range of 50° C. to 550° C. falls within a range of $3.38 \times 10^{-6}$ to $4.08 \times 10^{-6}$.

[3] According to another aspect of the present invention, there is provided a glass composition for protecting a semiconductor junction which contains at least $SiO_2$, $B_2O_3$, $Al_2O_3$, ZnO and at least two oxides of alkaline earth metals selected from a group consisting of CaO, MgO and BaO, and substantially contains none of Pb, As, Sb, Li, Na and K, wherein the content of $SiO_2$ falls within a range of 49.5 mol % to 64.3 mol %, the content of $B_2O_3$ falls within a range of 8.4 mol % to 17.9 mol %, the content of $Al_2O_2$ falls within a range of 3.7 mol % to 14.8 mol %, the content of ZnO falls within a range of 3.9 mol % to 14.2 mol %, and the content of the oxide of alkaline earth metal falls within a range of 7.4 mol % to 12.9 mol %.

[4] In the above-mentioned glass composition for protecting a semiconductor junction according to the present invention, it is preferable that a total content of the content of $SiO_2$ and the content of $B_2O_3$ falls within a range of 65 mol % to 75 mol %.

[5] In the above-mentioned glass composition for protecting a semiconductor junction according to the present invention, it is preferable that the glass composition contains, as the oxide of alkaline earth metal, all of CaO, MgO and BaO.

[6] In the above-mentioned glass composition for protecting a semiconductor junction according to the present invention, it is preferable that the content of CaO falls within a range of 2.0 mol % to 5.3 mol %, the content of MgO falls within a range of 1.0 mol % to 2.3 mol %, and the content of BaO falls within a range of 2.6 mol % to 5.3 mol %.

[7] In the above-mentioned glass composition for protecting a semiconductor junction according to the present invention, it is preferable that the glass composition contains, as the oxide of alkaline earth metal, CaO and BaO.

[8] In the above-mentioned glass composition for protecting a semiconductor junction according to the present invention, it is preferable that out of the oxides of alkaline earth metals, the content of CaO falls within a range of 2.0 mol % to 7.6 mol %, and the content of BaO falls within a range of 3.7 mol % to 5.9 mol %.

[9] In the above-mentioned glass composition for protecting a semiconductor junction according to the present invention, it is preferable that the glass composition further contains at least one metal oxide selected from a group consisting of nickel oxide, copper oxide, manganese oxide and zirconium oxide.

[10] In the above-mentioned glass composition for protecting a semiconductor junction according to the present invention, it is preferable that the content of at least one metal oxide selected from a group consisting of nickel oxide, copper oxide, manganese oxide and zirconium oxide falls within a range of 0.01 mol % to 2.0 mol %.

[11] According to still another aspect of the present invention, there is provided a method of manufacturing a semiconductor device which includes, in the following order: a first step of preparing a semiconductor element having a pn junction exposure portion where a pn junction is exposed; and a second step of forming a glass layer such that the glass layer covers the pn junction exposure portion, wherein in the second step, the glass layer is formed using a glass composition for protecting a semiconductor junction which contains at least $SiO_2$, $B_2O_3$, $Al_2O_3$, ZnO and at least two oxides of alkaline earth metals selected from a group consisting of CaO, MgO and BaO, and substantially contains none of Pb, As, Sb, Li, Na and K, the glass composition having an average linear expansion coefficient within a temperature range of 50° C. to 550° C. falls within a range of $3.33 \times 10^{-6}$ to $4.13 \times 10^{-6}$.

[12] According to still another aspect of the present invention, there is provided a method of manufacturing a semiconductor device which includes, in the following order: a first step of preparing a semiconductor element having a pn junction exposure portion where a pn junction is exposed; and a second step of forming a glass layer such that the glass layer covers the pn junction exposure portion, wherein in the second step, the glass layer is formed using a glass composition for protecting a semiconductor junction which contains at least $SiO_2$, $B_2O_2$, $Al_2O_2$, ZnO and at least two oxides of alkaline earth metals selected from a group consisting of CaO, MgO and BaO, and substantially contains none of Pb, As, Sb, Li, Na and K, and in the glass composition, the content of $SiO_2$ falls within a range of 49.5 mol % to 64.3 mol %, the content of $B_2O_3$ falls within a range of 8.4 mol % to 17.9 mol %, the content of $Al_2O_2$ falls within a range of 3.7 mol % to 14.8 mol %, the content of ZnO falls within a range of 3.9 mol % to 14.2 mol %, and the content of the oxide of alkaline earth metal falls within a range of 7.4 mol % to 12.9 mol %.

[13] In the above-mentioned method of manufacturing a semiconductor device according to the present invention, it is preferable that the first step includes: a step of preparing a semiconductor base body having a pn junction parallel to a main surface; and a step of forming the pn junction exposure portion in the inside of a trench by forming the trench from one surface of the semiconductor base body with a depth exceeding the pn junction, and the second step includes a step of forming the glass layer such that the glass layer covers the pn junction exposure portion in the inside of the trench.

[14] In the above-mentioned method of manufacturing a semiconductor device according to the present invention, it is preferable that the second step includes a step of forming the glass layer such that the glass layer directly covers the pn junction exposure portion in the trench.

[15] In the above-mentioned method of manufacturing a semiconductor device according to the present invention, it is preferable that the second step includes a step of forming an insulation layer over the pn junction exposure portion in the trench, and a step of forming the glass layer such that the glass layer covers the pn junction exposure portion with the insulation layer interposed therebetween.

[16] In the above-mentioned method of manufacturing a semiconductor device according to the present invention, it is preferable that the first step includes a step of forming the pn junction exposure portion on a surface of a semiconductor base body, and the second step includes a step of forming the glass layer such that the glass layer covers the pn junction exposure portion on the surface of the semiconductor base body.

[17] In the above-mentioned method of manufacturing a semiconductor device according to the present invention, it is preferable that the second step includes a step of forming the glass layer such that the glass layer directly covers the pn junction exposure portion on the surface of the semiconductor base body.

[18] In the above-mentioned method of manufacturing a semiconductor device according to the present invention, it is preferable that the second step includes a step of forming an insulation layer on the pn junction exposure portion on a surface of the semiconductor base body, and a step of forming the glass layer such that the glass layer covers the pn junction exposure portion with the insulation layer interposed therebetween.

[19] According to still another aspect of the present invention, there is provided a semiconductor device which includes: a semiconductor element having a pn junction exposure portion where a pn junction is exposed; and a glass layer which is formed such that the glass layer covers the pn junction exposure portion, wherein the glass layer is formed using a glass composition for protecting a semiconductor junction which contains at least $SiO_2$, $B_2O_3$, $Al_2O_2$, ZnO and at least two oxides of alkaline earth metals selected from a group consisting of CaO, MgO and BaO, and substantially contains none of Pb, As, Sb, Li, Na and K, wherein an average linear expansion coefficient within a temperature range of 50° C. to 550° C. falls within a range of $3.33\times10^{-6}$ to $4.13\times10^{-6}$.

[19] According to still another aspect of the present invention, there is provided a semiconductor device which includes: a semiconductor element having a pn junction exposure portion where a pn junction is exposed; and a glass layer which is formed such that the glass layer covers the pn junction exposure portion, wherein the glass layer is formed using a glass composition for protecting a semiconductor junction which contains at least $SiO_2$, $B_2O_3$, $Al_2O_2$, ZnO and at least two oxides of alkaline earth metals selected from a group consisting of CaO, MgO and BaO, and substantially contains none of Pb, As, Sb, Li, Na and K, and in the glass composition, the content of $SiO_2$ falls within a range of 49.5 mol % to 64.3 mol %, the content of $B_2O_3$ falls within a range of 8.4 mol % to 17.9 mol %, the content of $Al_2O_3$ falls within a range of 3.7 mol % to 14.8 mol %, the content of ZnO falls within a range of 3.9 mol % to 14.2 mol %, and the content of the oxide of alkaline earth metal falls within a range of 7.4 mol % to 12.9 mol %.

Advantage of the Invention

According to the glass composition for protecting a semiconductor junction, the method of manufacturing a semiconductor device and the semiconductor device of the present invention, as can be clearly understood from examples described later, a semiconductor device having high breakdown strength can be manufactured by using a glass material which contains no lead in the same manner as the conventional case where "a glass material containing lead silicate as a main component" is used.

Further, according to the glass composition for protecting a semiconductor junction, the method of manufacturing a semiconductor device and the semiconductor device of the present invention, an average linear expansion coefficient within a temperature range of 50° C. to 550° C. falls within a range of $3.33\times10^{-6}$ to $4.13\times10^{-6}$ so that the glass composition has a linear expansion coefficient close to a linear expansion coefficient of silicon whereby it is possible to make the warping of the wafer during steps extremely small. Accordingly, the semiconductor device having an excellent forward breakdown voltage characteristic can be manufactured using a thin wafer, and the semiconductor device having an excellent reverse breakdown voltage characteristic can be also manufactured by increasing a thickness of the glass layer.

Further, according to the glass composition for protecting a semiconductor junction, the method of manufacturing a semiconductor device and the semiconductor device of the present invention, the content of $SiO_2$ falls within a range of 49.5 mol % to 64.3 mol %, the content of $B_2O_3$ falls within a range of 8.4 mol % to 17.9 mol %, the content of $Al_2O_2$ falls within a range of 3.7 mol % to 14.8 mol %, the content of ZnO falls within a range of 3.9 mol % to 14.2 mol %, and the content of the oxide of alkaline earth metal falls within a range of 7.4 mol % to 12.9 mol %. Accordingly, it is possible to set an average linear expansion coefficient of the glass composition for protecting a semiconductor junction within a temperature range of 50° C. to 550° C. to a linear expansion coefficient ($3.33\times10^{-6}$ to $4.13\times10^{-6}$, for example) close to a linear expansion coefficient of silicon without causing the crystallization in the process of vitrification. For this reason, it is possible to make the warping of the wafer during steps extremely small and hence, the semiconductor device having an excellent forward breakdown voltage characteristic can be manufactured using a thin wafer, and the semiconductor device having an excellent reverse breakdown voltage characteristic can be also manufactured by increasing a thickness of the glass layer.

In the glass composition for protecting a semiconductor junction according to the present invention, "to contain at least some specific components ($SiO_2$, $B_2O_3$ and the like)" means not only the case where the glass composition contains only such specific components but also the case where the glass composition also contains other components which can be usually contained in the glass composition besides such specific components.

In the glass composition for protecting a semiconductor junction according to the present invention, "to substantially contain no specific element (Pb, As or the like)" means that the glass composition contains no any such a specific element as the specific component, and does not exclude the glass composition in which the above-mentioned specific element is mixed as an impurity in the glass materials which constitute respective components of glass. The same goes for the method of manufacturing a semiconductor device and the semiconductor device of the present invention.

When the glass composition for protecting a semiconductor junction is so-called glass composition of oxide system as in the case of the present invention, "to contain no specific element (Pb, As or the like)" means that the glass composition contains none of oxide of the specific element, none of nitride of the specific element or the like.

The reason the glass composition substantially contains no Pb is that the object of the present invention lies in that a semiconductor device having high breakdown strength can be manufactured by using a glass material which contains no lead in the same manner as the conventional case where "a glass material containing lead silicate as a main component" is used.

The reason the glass composition substantially contains neither As nor Sb is that these components are toxic and hence, there has been the movement to limit the use of these components.

The reason the glass composition substantially contains none of Li, Na and K is that when the glass composition contains these components, although the glass composition can acquire advantageous effects with respect to an average linear expansion coefficient and a baking temperature, there may be a case where the insulation property is lowered.

As the result of the extensive studies that the inventors of the present invention have made, the inventors have found that the glass composition which contains at least $SiO_2$, $B_2O_3$, $Al_2O_3$, ZnO and at least two oxides of alkaline earth metals selected from a group consisting of Cao, MgO and BaO can be sufficiently used as the glass composition for protecting a semiconductor junction even when the glass composition substantially contains none of components (that is, Pb, As, Sb, Li, Na and K). That is, according to the glass composition for protecting a semiconductor junction according to the present invention, a semiconductor device having high breakdown strength can be manufactured by using a glass material which contains no lead in the same manner as the conventional case where "a glass material containing lead silicate as a main component" is used.

BRIEF DESCRIPTION OF THE DRAWINGS

FIG. 9 is a Table showing conditions and results of examples.

FIG. 13 is a Table showing the compositions at 18 levels and the result of a preliminary evaluation.

MODE FOR CARRYING OUT THE INVENTION

Figure 1A:
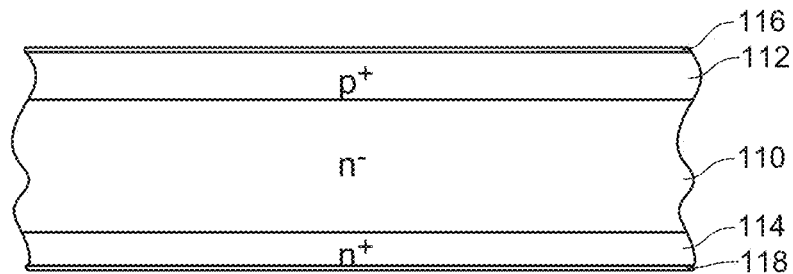
FIG. 1A to FIG. 1D are views for explaining a method of manufacturing a semiconductor device according to an embodiment 4.
Figure 1B:
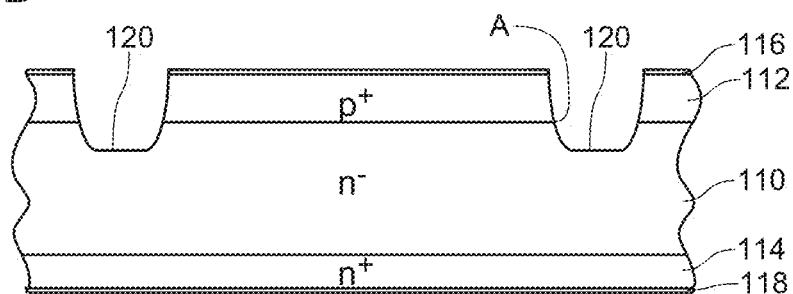

Hereinafter, a glass composition for protecting a semiconductor junction, a method of manufacturing a semiconductor device and a semiconductor device according to the present invention are explained in conjunction with embodiments shown in the drawings.

Embodiment 1

The embodiment 1 relates to an embodiment of a glass composition for protecting a semiconductor junction.

The glass composition for protecting a semiconductor junction of the embodiment 1 contains at least $SiO_2$, $B_2O_3$, $Al_2O_3$, ZnO, all oxides of alkaline earth metals of CaO, MgO and BaO, and nickel oxide, and substantially contains none of Pb, As, Sb, Li, Na and K. In this case, "to contain some specific components" means not only the case where the glass composition contains only such specific components but also the case where the glass composition also contains other components which can be usually contained in the glass composition besides such specific components. Further, "to substantially contain no specific element" means that the glass composition contains no any such a specific element as the specific component, and does not exclude the glass composition in which the above-mentioned specific element is mixed as an impurity in the glass materials which constitute respective components of glass. "To substantially contain no specific element" also means that the glass composition contains none of oxide of such a specific element, none of nitride of such a specific element or the like.

To be more specific, the content of $SiO_2$ falls within a range of 49.5 mol % to 64.3 mol %, the content of $B_2O_3$ falls within a range of 8.4 mol % to 17.9 mol %, the content of $Al_2O_3$ falls within a range of 3.7 mol % to 14.8 mol %, the content of ZnO falls within a range of 3.9 mol % to 14.2 mol %, the content of the oxide of alkaline earth metal falls within a range of 7.4 mol % to 12.9 mol %, and the content of nickel oxide falls within a range of 0.01 mol % to 2.0 mol %. With respect to the oxides of alkaline earth metals, the content of CaO falls within a range of 2.0 mol % to 5.3 mol %, the content of MgO falls within a range of 1.0 mol % to 2.3 mol %, and the content of BaO falls within a range of 2.6 mol % to 5.3 mol %. A total content of the content of $SiO_2$ and the content of $B_2O_3$ falls within a range of 65 mol % to 75 mol %. An average linear expansion coefficient within a temperature range of 50° C. to 550° C. falls within a range of $3.33 \times 10^{-6}$ to $4.13 \times 10^{-6}$.

According to the glass composition for protecting a semiconductor junction of the embodiment 1, as can be clearly understood from examples described later, a semiconductor device having high breakdown strength can be manufactured by using a glass material which contains no lead in the same manner as the conventional case where "a glass material containing lead silicate as a main component" is used.

According to the glass composition for protecting a semiconductor junction of the embodiment 1, an average linear expansion coefficient within a temperature range of 50° C. to 550° C. falls within a range of $3.33 \times 10^{-6}$ to $4.13 \times 10^{-6}$ so that the glass composition has a linear expansion coefficient close to a linear expansion coefficient of silicon whereby it is possible to make the warping of the wafer during steps extremely small. Accordingly, the semiconductor device having an excellent forward breakdown voltage characteristic can be manufactured using a thin wafer, and the semiconductor device having an reverse breakdown voltage characteristic can be also manufactured by increasing a thickness of the glass layer.

According to the glass composition for protecting a semiconductor junction of the embodiment 1, the content of $SiO_2$ falls within a range of 49.5 mol % to 64.3 mol %, the content of $B_2O_3$ falls within a range of 8.4 mol % to 17.9 mol %, the content of $Al_2O_3$ falls within a range of 3.7 mol % to 14.8 mol %, the content of ZnO falls within a range of 3.9 mol % to 14.2 mol %, and the content of the oxide of alkaline earth metal falls within a range of 7.4 mol % to 12.9 mol %. Accordingly, it is possible to set an average linear expansion coefficient of the glass composition for protecting a semiconductor junction within a temperature range of 50° C. to 550° C. to a value ($3.33 \times 10^{-6}$ to $4.13 \times 10^{-6}$, for example) close to a linear expansion coefficient of silicon without causing the crystallization in the process of vitrification. For this reason, it is possible to make the warping of the wafer during steps extremely small and hence, the semiconductor device having an excellent forward breakdown voltage characteristic can be manufactured using a thin wafer, and the semiconductor device having an excellent reverse breakdown voltage characteristic can be also manufactured by increasing a thickness of the glass layer.

The reason the content of $SiO_2$ is set to a value which falls within a range of 49.5 mol % to 64.3 mol % is that when the content of $SiO_2$ is less than 49.5 mol %, there may be a case where the resistance to chemicals is lowered or the insulation property is lowered, while when the content of $SiO_2$ exceeds 64.3 mol %, there exists a tendency that a baking temperature needs to be elevated.

The reason the content of $B_2O_3$ is set to a value which falls within a range of 8.4 mol % to 17.9 mol % is that when the content of $B_2O_3$ is less than 8.4 mol %, there is a tendency that a baking temperature needs to be elevated, while when the content of $B_2O_3$ exceeds 17.9 mol %, there is a tendency that an average linear expansion coefficient is increased.

The reason the content of $Al_2O_3$ is set to a value which falls within a range of 3.7 mol % to 14.8 mol % is that when the content of $Al_2O_3$ is less than 3.7 mol %, there is a tendency that the glass composition is liable to be crystallized in the process of vitrification, while when the content of $Al_2O_3$ exceeds 14.8 mol %, there is a tendency that the insulation property is lowered.

The reason the content of ZnO is set to a value which falls within a range of 3.9 mol % to 14.2 mol % is that when the content of ZnO is less than 3.9 mol %, there is a tendency that a baking temperature needs to be elevated, while when the content of ZnO exceeds 14.2 mol %, there may be a case where the resistance to chemicals is lowered or the insulation property is lowered, and there is also a tendency that the glass composition is liable to be crystallized in the process of vitrification.

The reason the content of oxide of alkaline earth metal is set to a value which falls within a range of 7.4 mol % to 12.9 mol % is that when the content of oxide of alkaline earth metal is less than 7.4 mol %, there is a tendency that a baking temperature needs to be elevated, while when the content of oxide of alkaline earth metal exceeds 12.9 mol %, there may be a case where the resistance to chemicals is lowered or the insulation property is lowered.

The reason the content of CaO out of oxides of alkaline earth metals is set to a value which falls within a range of 2.0 mol % to 5.3 mol % is that when the content of CaO is less than 2.0 mol %, there is a tendency that a baking temperature needs to be elevated, while when the content of CaO exceeds 5.3 mol %, there may be a case where the resistance to chemicals is lowered or the insulation property is lowered.

The reason the content of MgO is set to a value which falls within a range of 1.0 mol % to 2.3 mol % is that when the content of MgO is less than 1.0 mol %, there is a tendency that a baking temperature needs to be elevated, while when the content of MgO exceeds 2.3 mol %, there may be a case where the resistance to chemicals is lowered or the insulation property is lowered.

The reason the content of BaO is set to a value which falls within a range of 2.6 mol % to 5.3 mol % is that when the content of BaO is less than 2.6 mol %, there is a tendency that a baking temperature needs to be elevated, while when the content of BaO exceeds 5.3 mol %, there may be a case where the resistance to chemicals is lowered or the insulation property is lowered.

The reason the content of nickel oxide is set to a value which falls within a range of 0.01 mol % to 2.0 mol % is that when the content of nickel oxide is less than 0.01 mol %, there may be a case where it becomes difficult to suppress the generation of bubbles which may be generated from an interface between a "layer made of the glass composition for protecting a semiconductor junction" formed by an electrophoresis method and a silicon substrate in the process of baking the "layer made of the glass composition for protecting a semiconductor junction", while when the content of nickel oxide exceeds 2.0 mol %, there is a tendency that the glass composition is liable to be crystallized in the process of vitrification.

The reason a total content of the content of $SiO_2$ and the content of $B_2O_3$ is set to a value which falls within a range of 65 mol % to 75 mol % is that when the total content of the content of $SiO_2$ and the content of $B_2O_3$ is less than 65 mol %, there is a tendency that a linear expansion coefficient is excessively increased, while when the total content of the content of $SiO_2$ and the content of $B_2O_3$ exceeds 75 mol %, there is a tendency that the glass composition is liable to be crystallized in the process of vitrification.

The glass composition for protecting a semiconductor junction of the embodiment 1 can be manufactured as follows. That is, raw materials ($SiO_2$, $H_2BO_2$, $Al_2O_2$, ZnO, $CaCO_3$, MgO, $BaCO_3$ and NiO) are prepared at the above-mentioned composition ratio (molar ratio), these raw materials are sufficiently mixed and stirred together by a mixer and, thereafter, the mixed raw material is put into a platinum crucible, a temperature of the mixed raw material is elevated up to a predetermined temperature (1550° C., for example) in an electric furnace and is melted for a predetermined time. Then, the material in a molten state is made to flow out from the crucible and is fed to water-cooled rolls so that glass flakes in a flaky shape are obtained. Thereafter, the glass flakes are pulverized by a ball mill or the like until the glass flakes obtain a predetermined average particle size thus manufacturing the powdery glass composition.

Embodiment 2

The embodiment 2 relates to a glass composition for protecting a semiconductor junction.

The glass composition for protecting a semiconductor junction of the embodiment 2 contains at least $SiO_2$, $B_2O_3$, $Al_2O_3$, ZnO, at least two oxides of alkaline earth metals (CaO and BaO) and nickel oxide, and substantially contains none of Pb, As, Sb, Li, Na and K. In this case, "to contain some specific components" means not only the case where the glass composition contains only such specific components but also the case where the glass composition also contains other components which can be usually contained in the glass composition besides such specific components. Further, "to substantially contain no specific element" means that the glass composition contains no any such a specific element as the specific component, and does not exclude the glass composition in which the above-mentioned specific element is mixed as an impurity in the raw materials which constitute respective components of glass. "To substantially contain no specific element" means that the glass composition contains none of oxide of such a specific element, none of nitride of such a specific element or the like.

In this embodiment, the content of $SiO_2$, the content of $B_2O_2$, the content of $Al_2O_2$, the content of ZnO, the content of oxide of alkaline earth metal, the content of nickel oxide and a total content of the content of $SiO_2$ and the content of $B_2O_3$ are substantially equal to the contents of the corresponding compositions of the glass composition for protecting a semiconductor junction of the embodiment 1. In the same manner as the glass composition for protecting a semiconductor junction of the embodiment 1, an average linear expansion coefficient of the glass composition at a temperature of 50° C. to 550° C. also falls within a range of $3.33 \times 10^{-6}$ to $4.13 \times 10^{-6}$. Out of oxides of alkaline earth metals, the content of CaO falls within a range of 2.0 mol % to 7.6 mol %, and the content of BaO falls within a range of 3.7 mol % to 5.9 mol %.

In this manner, the glass composition for protecting a semiconductor junction of the embodiment 2 differs from the glass composition for protecting a semiconductor junction of the embodiment 1 with respect to a point that the glass composition contains CaO and BaO as oxides of alkaline earth metals. However, as can be clearly understood from examples described later, a semiconductor device having high breakdown strength can be manufactured by using the glass material which contains no lead in the same manner as the conventional case where "a glass material containing lead silicate as a main component" is used.

According to the glass composition for protecting a semiconductor junction of the embodiment 2, an average linear expansion coefficient within a temperature range of 50° C. to 550° C. falls within a range of $3.33 \times 10^{-6}$ to $4.13 \times 10^{-6}$ so that the glass composition has a linear expansion coefficient close to a linear expansion coefficient of silicon whereby it is possible to make the warping of the wafer during steps extremely small. Accordingly, the semiconductor device having an excellent forward breakdown voltage characteristic can be manufactured using a thin wafer, and the semiconductor device having an excellent reverse breakdown voltage characteristic can be also manufactured by increasing a thickness of the glass layer.

According to the glass composition for protecting a semiconductor junction of the embodiment 2, the content of $SiO_2$, the content of $B_2O_3$, the content of $Al_2O_3$, the content of ZnO, the content of oxide of alkaline earth metal and the content of nickel oxide are equal to the corresponding contents of the components in the glass composition for protecting a semiconductor junction of the embodiment 1. Accordingly, it is possible to set an average linear expansion coefficient of the glass composition for protecting a semiconductor junction within a temperature range of 50° C. to 550° C. to a linear expansion coefficient ($3.33 \times 10^{-6}$ to $4.13 \times 10^{-6}$, for example) close to a linear expansion coefficient of silicon without causing the crystallization in the process of vitrification. For this reason, it is possible to make the warping of the wafer during steps extremely small. As a result, the semiconductor device having an excellent forward breakdown voltage characteristic can be manufactured using a thin wafer, and the semiconductor device having an excellent reverse breakdown voltage characteristic can be also manufactured by increasing a thickness of the glass layer.

The reason the content of $SiO_2$, the content of $B_2O_3$, the content of $Al_2O_3$, the content of ZnO, the content of oxide of alkaline earth metal and the content of nickel oxide of the glass composition for protecting a semiconductor junction of the embodiment 2 are set to values which fall within the above-mentioned ranges is substantially equal to the reason the corresponding contents of the components in the glass composition for protecting a semiconductor junction of the embodiment 1 are set.

The reason the content of CaO out of oxides of alkaline earth metals is set to a value which falls within a range of 2.0 mol % to 7.6 mol % is that when the content of CaO is less than 2.0 mol %, there is a tendency that a baking temperature needs to be elevated, while when the content of CaO exceeds 7.6 mol %, there may be a case where the resistance to chemicals is lowered or the insulation property is lowered.

The reason the content of BaO is set to a value which falls within a range of 3.7 mol % to 5.9 mol % is that when the content of BaO is less than 3.7 mol %, there exists a tendency that a baking temperature needs to be elevated, while when the content of BaO exceeds 5.9 mol %, there may be a case where the resistance to chemicals is lowered or the insulation property is lowered.

The glass composition for protecting a semiconductor junction of the embodiment 2 can be manufactured as follows. That is, raw materials ($SiO_2$, $H_2BO_2$, $Al_2O_2$, ZnO, $CaCO_3$, $BaCO_2$, and NiO) are prepared at the above-mentioned composition ratio (molar ratio), these raw materials are sufficiently mixed and stirred together by a mixer and, thereafter, the mixed raw material is put into a platinum crucible, a temperature of the mixed raw material is elevated up to a predetermined temperature (1550° C., for example) in an electric furnace and is melted for a predetermined time. Then, the material in a molten state is made to flow out from the crucible and is fed to water-cooled rolls so that glass flakes in a flaky shape are obtained. Thereafter, the glass flakes are pulverized by a ball mill or the like until the glass flakes obtain a predetermined average particle size thus manufacturing the powdery glass composition.

Embodiment 3

The embodiment 3 relates to a glass composition for protecting a semiconductor junction.

The glass composition for protecting a semiconductor junction of the embodiment 3 basically contains the substantially same components as the glass composition for protecting a semiconductor junction of the embodiment 1. However, the glass composition for protecting a semiconductor junction of the embodiment 3 differs from the glass composition for protecting a semiconductor junction of the embodiment 1 with respect to a point that the glass composition for protecting a semiconductor junction of the embodiment 3 contains no nickel oxide. That is, the glass composition for protecting a semiconductor junction of the embodiment 3 contains at least $SiO_2$, $B_2O_3$, $Al_2O_2$, ZnO and all oxides of alkaline earth metals of CaO, MgO and BaO, and substantially contains none of Pb, As, Sb, Li, Na and K. In this case, "to contain some specific components" means not only the case where the glass composition contains only such specific components but also the case where the glass composition also contains other components which can be usually contained in the glass composition besides such specific components. Further, "to substantially contain no specific element" means that the glass composition contains no any such a specific element as the specific component, and does not exclude the glass composition in which the above-mentioned specific element is mixed as an impurity in the raw materials which constitute respective components of glass. "To substantially contain no specific element" means that the glass composition contains none of oxide of such a specific element, none of nitride of such a specific element or the like.

The content of $SiO_2$, the content of $B_2O_3$, the content of $Al_2O_2$, the content of ZnO, the content of oxide of alkaline earth metal, the content of CaO, the content of MgO, the content of BaO and a total content of the content of $SiO_2$ and the content of $B_2O_3$ of the glass composition for protecting a semiconductor junction of the embodiment 3 are equal to the contents the corresponding compositions of the glass composition for protecting a semiconductor junction of the embodiment 1. An average linear expansion coefficient of the glass composition of the embodiment 3 at a temperature of 50° C. to 550° C. also falls within a range of $3.33 \times 10^{-6}$ to $4.13 \times 10^{-6}$ in the same manner as the glass composition for protecting a semiconductor junction of the embodiment 1.

According to the glass composition for protecting a semiconductor junction of the embodiment 3, in the same manner as the glass composition for protecting a semiconductor junction of the embodiment 1, a semiconductor device having high breakdown strength can be manufactured by using a glass material which contains no lead in the same manner as the conventional case where "a glass material containing lead silicate as a main component" is used.

According to the glass composition for protecting a semiconductor junction of the embodiment 3, an average linear expansion coefficient within a temperature range of 50° C. to 550° C. falls within a range of $3.33 \times 10^{-6}$ to $4.13 \times 10^{-6}$ so that the glass composition has a linear expansion coefficient close to a linear expansion coefficient of silicon whereby it is possible to make the warping of the wafer during steps extremely small. Accordingly, the semiconductor device having an excellent forward breakdown voltage characteristic can be manufactured using a thin wafer, and the semiconductor device having an excellent reverse breakdown voltage characteristic can be manufactured by increasing a thickness of the glass layer.

According to the glass composition for protecting a semiconductor junction of the embodiment 3, the content of $SiO_2$, the content of $B_2O_2$, the content of $Al_2O_2$, the content of ZnO, and the content of oxide of alkaline earth metal are equal to the contents of the corresponding components of the glass composition for protecting a semiconductor junction of the embodiment 1. Accordingly, it is possible to set an average linear expansion coefficient of the glass composition for protecting a semiconductor junction within a temperature range of 50° C. to 550° C. to a value ($3.33 \times 10^{-6}$ to $4.13 \times 10^{-6}$, for example) close to a linear expansion coefficient of silicon without causing the crystallization in the process of vitrification. For this reason, it is possible to make the warping of the wafer during steps extremely small. As a result, the semiconductor device having an excellent forward breakdown voltage characteristic can be manufactured using a thin wafer, and the semiconductor device having an excellent reverse breakdown voltage characteristic can be also manufactured by increasing a thickness of the glass layer.

The reason the content of $SiO_2$, the content of $B_2O_3$, the content of $Al_2O_3$, the content of ZnO, the content of oxide of alkaline earth metal, the content of CaO, the content of MgO, the content of BaO and a total content of the content of $SiO_2$ and the content of $B_2O_3$ of the glass composition for protecting a semiconductor junction of the embodiment 3 are set to values which fall within the above-mentioned ranges is equal to the reason the contents of the corresponding components of the glass composition for protecting a semiconductor junction of the embodiment 1 are set.

The reason the composition contains no nickel oxide is that even when the composition contains no nickel oxide, there may be a case where it is possible to suppress the generation of bubbles which may be generated from an interface between a "layer made of the glass composition for protecting a semiconductor junction" formed by an electrophoresis method and a silicon substrate in the process of baking the "layer made of the glass composition for protecting a semiconductor junction".

The glass composition for protecting a semiconductor junction of the embodiment 3 can be manufactured as follows. That is, raw materials ($SiO_2$, $H_3BO_3$, $Al_2O_3$, ZnO, $CaCO_3$, MgO and $BaCO_3$) are prepared at the above-mentioned composition ratio (molar ratio), these raw materials are sufficiently mixed and stirred together by a mixer and, thereafter, the mixed raw material is put into a platinum crucible, a temperature of the mixed raw material is elevated up to a predetermined temperature (1550° C., for example) in an electric furnace and is melted for a predetermined time. Then, the material in a molten state is made to flow out from the crucible and is fed to water-cooled rolls so that glass flakes in a flaky shape are obtained. Thereafter, the glass flakes are pulverized by a ball mill or the like until the glass flakes obtain a predetermined average particle size thus manufacturing the powdery glass composition.

Embodiment 4

The embodiment 4 relates to a method of manufacturing a semiconductor device.

The method of manufacturing a semiconductor device of the embodiment 4 includes, in the following order: a first step of preparing a semiconductor element which includes a pn junction exposure portion where a pn junction is exposed; and a second step of forming a glass layer such that the glass layer covers the pn junction exposure portion. In the second step, the glass layer is formed using the glass composition for protecting a semiconductor junction of the embodiment 1. The first step includes: a step of preparing a semiconductor base body in which a pn junction arranged parallel to a main surface of the semiconductor base body is formed; and a step of forming trenches having a depth exceeding the pn junction from one surface of a semiconductor base body thus forming a pn junction exposure portion in the trenches, and the second step includes a step of forming the glass layer such that the glass layer directly covers the pn junction exposure portion in the inside of the trench.

FIG. 1A to FIG. 1D and FIG. 2A to FIG. 2D are views for explaining the method of manufacturing a semiconductor device of the embodiment 4. FIG. 1A to FIG. 1D and FIG. 2A to FIG. 2D are views showing respective steps of the method of manufacturing a semiconductor device.

In the method of manufacturing a semiconductor device of the embodiment 4, as shown in FIG. 1A to FIG. 1D and FIG. 2A to FIG. 2D, "semiconductor base body forming step", "trench forming step", "glass layer forming step", "photoresist forming step", "oxide film removing step", "roughened surface region forming step", "electrode forming step", and "semiconductor base body cutting step" are performed in this order. Hereinafter, the method of manufacturing a semiconductor device of the embodiment 4 is explained in the order of these steps.

(a) Semiconductor Base Body Forming Step

Firstly, a p$^+$ type diffusion layer 112 is formed by diffusion of a p type impurity from one surface of an n$^-$ type semiconductor substrate (n$^-$ type silicon substrate) 110, and an n$^+$ type diffusion layer 114 is formed by diffusion of an n type impurity from the other surface of the n$^-$ type semiconductor substrate 110 thus forming a semiconductor base body in which a pn junction arranged parallel to a main surface of the semiconductor base body is formed. Thereafter, oxide films 116, 118 are formed by thermal oxidation on a surface of the p$^+$ type diffusion layer 112 and a surface of the n$^+$ type diffusion layer 114 respectively (see FIG. 1A).

(b) Trench Forming Step

Next, predetermined opening portions are formed on the oxide film 116 at predetermined positions by photo etching. After etching the oxide film, subsequently, the semiconductor base body is etched thus forming trenches 120 having a depth exceeding the pn junction from one surface of the semiconductor base body (see FIG. 1B). Along with such formation of the trenches, a pn junction exposure portion A is formed on inner surfaces of the trenches.

(c) Glass Layer Forming Step

Figure 1C:
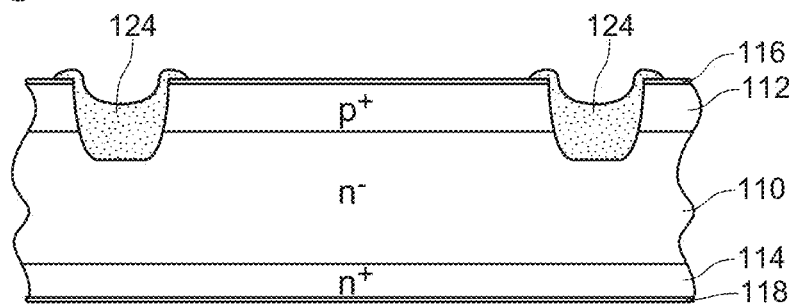

Next, a layer made of the glass composition for protecting a semiconductor junction of the embodiment 1 is formed on inner surfaces of the trenches 120 and a surface of the semiconductor base body in the vicinity of the trenches 120 by an electrophoresis method, and the layer made of the glass composition for protecting a semiconductor junction is baked so that a glass layer 124 for passivation is formed on surfaces of the trenches 120 (see FIG. 1C). Accordingly, the pn junction exposure portion in the inside of the trench 120 is brought into a state where the pn junction exposure portion is directly covered with the glass layer 124.

(d) Photoresist Forming Step

Figure 1D:
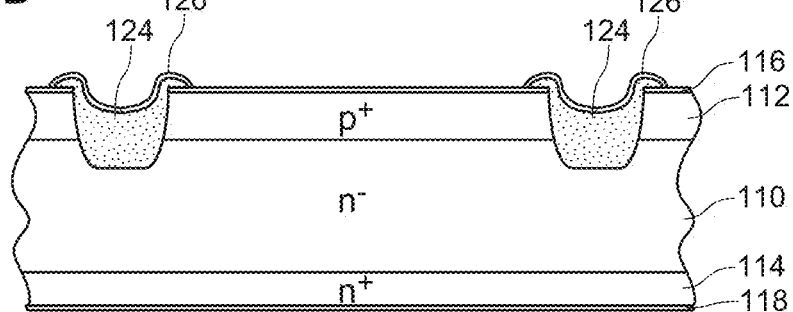

Next, a photoresist 126 is formed such that the photoresist 126 covers a surface of the glass layer 124 (see FIG. 1D).

(e) Oxide Film Removing Step

Figure 2A:
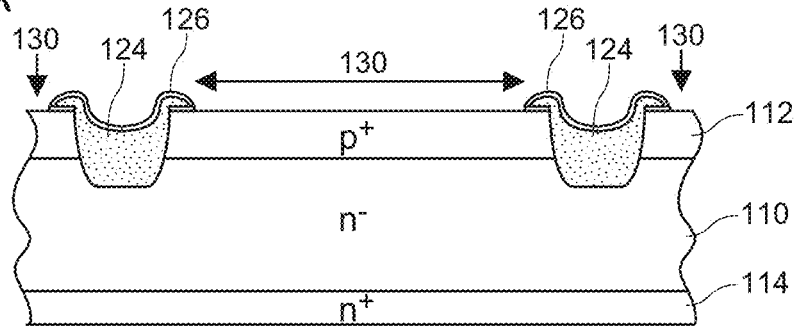
FIG. 2A to FIG. 2D are views for explaining the method of manufacturing a semiconductor device according to the embodiment 4.

Next, the oxide film 116 is etched using the photoresist 126 as a mask so that the oxide films 116, 118 at a position 130 where an Ni plating electrode film is to be formed are removed (see FIG. 2A).

(f) Roughened Surface Region Forming Step

Figure 2B:
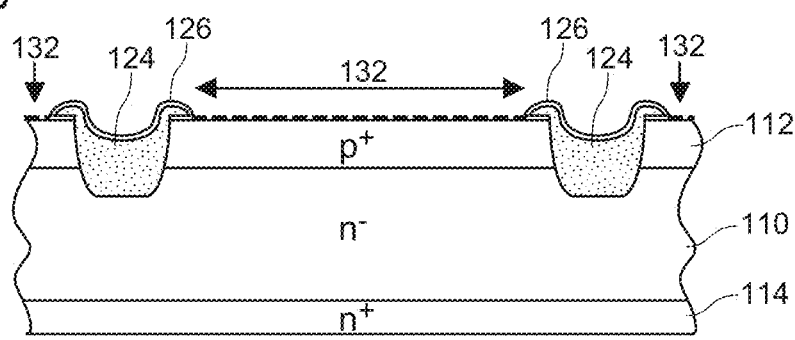

Next, a surface of the semiconductor base body at the position 130 where the Ni-plating electrode film is to be formed is subjected to surface roughening treatment thus forming a roughened surface region 132 for enhancing adhesiveness between the Ni plating electrode and the semiconductor base body (see FIG. 2B).

(g) Electrode Forming Step

Figure 2C:
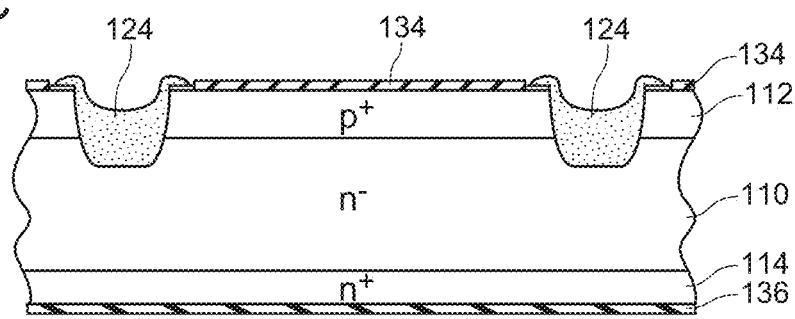

Next, Ni plating is applied to the semiconductor base body thus forming an anode electrode 134 on the roughened surface region 132 and forming a cathode electrode 136 on the other surface of the semiconductor base body (see FIG. 2C).

(h) Semiconductor Base Body Cutting Step

Figure 2D:
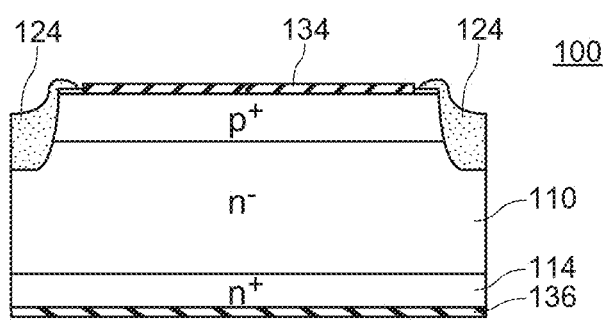

Next, the semiconductor base body is cut by dicing or the like at a center portion of the glass layer 124 thus dividing the semiconductor base body into chips whereby mesa-type semiconductor devices (pn diodes) are manufactured (see FIG. 2D).

Through the above-mentioned steps, the mesa-type semiconductor device having high breakdown strength (semiconductor device of the embodiment 4) 100 can be manufactured.

Embodiment 5

The embodiment 5 relates to a method of manufacturing a semiconductor device.

In the same manner as the method of manufacturing a semiconductor device of the embodiment 4, the method of manufacturing a semiconductor device of the embodiment 5 includes, in the following order: a first step of preparing a semiconductor element which includes a pn junction exposure portion where a pn junction is exposed; and a second step of forming a glass layer such that the glass layer covers the pn junction exposure portion. In the second step, the glass layer is formed by using the glass composition for protecting a semiconductor junction of the embodiment 1. However, different from the method of manufacturing a semiconductor device of the embodiment 4, in the method of manufacturing a semiconductor device of the embodiment 5, the first step includes a step of forming the pn junction exposure portion on a surface of the semiconductor base body, and the second step includes a step of forming the glass layer such that the glass layer directly covers the pn junction exposure portion on the surface of the semiconductor base body.

FIG. 3A to FIG. 3C and FIG. 4A to FIG. 4C are views for explaining a method of manufacturing a semiconductor device of the embodiment 5. That is, FIG. 3A to FIG. 3C and FIG. 4A to FIG. 4C are views showing respective steps of the method of manufacturing a semiconductor device.

In the method of manufacturing the semiconductor device of the embodiment 5, as shown in FIG. 3A to FIG. 3C and FIG. 4A to FIG. 4C, "semiconductor base body preparing step", "p$^+$ type diffusion layer forming step", "n$^+$ type diffusion layer forming step", "glass layer forming step", "glass layer etching step", "electrode forming step" and "semiconductor base body cutting step" are performed in this order. Hereinafter, the method of manufacturing a semiconductor device of the embodiment 5 is explained in the order of these steps.

Figure 3A:
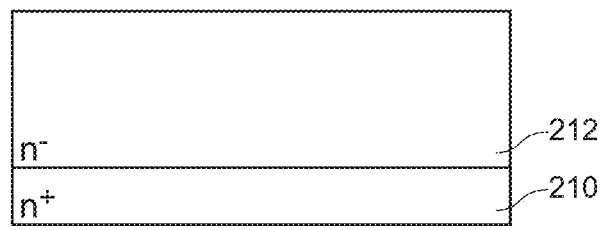
FIG. 3A to FIG. 3C are views for explaining a method of manufacturing a semiconductor device according to an embodiment 5.
Figure 3B:
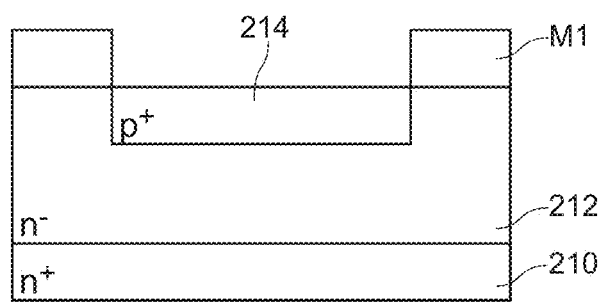
Figure 3C:
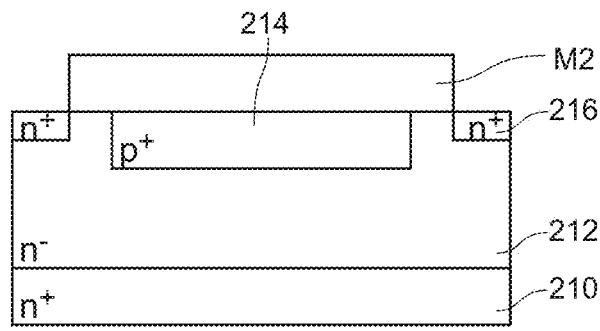

(a) Semiconductor Base Body Preparing Step Firstly, a semiconductor base body where an n$^-$ type epitaxial layer 212 is laminated on an n$^+$ type silicon substrate 210 is prepared (see FIG. 3A).

(b) p$^+$ Type Diffusion Layer Forming Step

Next, after forming a mask M1 on the n$^-$ type epitaxial layer 212, a p type impurity (boron ion, for example) is injected into a predetermined region on a surface of the n$^-$ type epitaxial layer 212 by an ion implantation method using the mask M1. Then, a p$^+$ type diffusion layer 214 is formed by thermal diffusion (see FIG. 3B).

(c) n$^+$ Type Diffusion Layer Forming Step

Next, the mask M1 is removed from the n$^-$ type epitaxial layer 212 and a mask M2 is formed on the n$^-$ type epitaxial layer 212. Thereafter, an n type impurity (arsenic ion, for example) is injected into a predetermined region on the surface of the n$^-$ type epitaxial layer 212 by an ion implantation method using the mask M2. Then, an n$^+$ type diffusion layer 216 is formed by thermal diffusion (see FIG. 3C).

(d) Glass Layer Forming Step

Next, the mask M2 is removed from the n$^-$ type epitaxial layer 212. Thereafter, a layer made of the glass composition for protecting a semiconductor junction of the embodiment 1 is formed on the surface of the n$^-$ type epitaxial layer 212 by a spin coating method and, then, the layer made of the glass composition for protecting a semiconductor junction is baked thus forming a glass layer 215 for passivation (see FIG. 4A).

(e) Glass Layer Etching Step

Next, a mask M3 is formed on a surface of the glass layer 215 and, thereafter, the glass layer 215 is etched (see FIG.

4B). Due to such etching, a glass layer 217 is formed on a predetermined region on the surface of the n⁻ type epitaxial layer 212.

(f) Electrode Forming Step

Figure 4A:
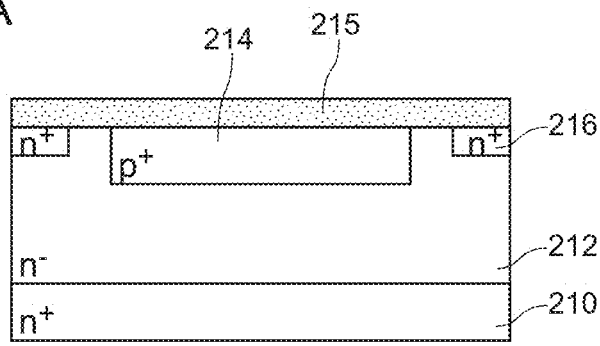
FIG. 4A to FIG. 4C are views for explaining the method of manufacturing a semiconductor device according to the embodiment 5.
Figure 4B:
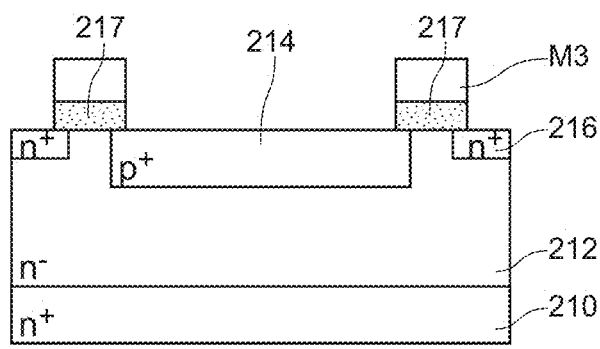
Figure 4C:
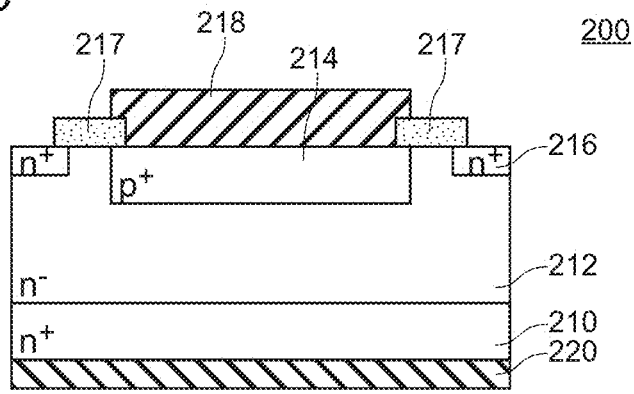

Next, the mask M3 is removed from the surface of the glass layer 217 and, thereafter, an anode electrode 218 is formed on a region of the surface of the semiconductor base body surrounded by the glass layer 217, and a cathode electrode 220 is formed on a back surface of the semiconductor base body (see FIG. 4C).

(g) Semiconductor Base Body Cutting Step

Next, the semiconductor base body is cut by dicing or the like thus dividing the semiconductor base body into chips whereby semiconductor devices (planar-type pn diodes) 200 are manufactured (not shown in the drawing).

Through the above-mentioned steps, a planar-type semiconductor device having high breakdown strength (the semiconductor device of the embodiment 5) 200 can be manufactured.

Embodiment 6

In the same manner as the method of manufacturing a semiconductor device of the embodiment 4, the method of manufacturing a semiconductor device of the embodiment 6 includes, in the following order: a first step of preparing a semiconductor element which includes a pn junction exposure portion where a pn junction is exposed; and a second step of forming a glass layer such that the glass layer covers the pn junction exposure portion. In the second step, the glass layer is formed using the glass composition for protecting a semiconductor junction of the embodiment 1. However, different from the method of manufacturing a semiconductor device of the embodiment 4, in the method of manufacturing a semiconductor device of the embodiment 6, the second step includes: a step of forming an insulation layer on the pn junction exposure portion in the trench; and a step of forming the glass layer such that the glass layer covers the pn junction exposure portion with the insulation layer interposed therebetween. In the method of manufacturing a semiconductor device of the embodiment 6, a mesa-type pn diode is manufactured as the semiconductor device.

FIG. 5A to FIG. 5D and FIG. 6A to FIG. 6D are views for explaining the method of manufacturing a semiconductor device of the embodiment 6. FIG. 5A to FIG. 5D and FIG. 6A to FIG. 6D are views showing respective steps of the method of manufacturing a semiconductor device.

In the method of manufacturing a semiconductor device of the embodiment 6, as shown in FIG. 5A to FIG. 5D and FIG. 6A to FIG. 6D, "semiconductor base body forming step", "trench forming step", "insulation layer forming step", "glass layer forming step", "photoresist forming step", "oxide film removing step", "roughened surface region forming step", "electrode forming step", and "semiconductor base body cutting step" are performed in this order. Hereinafter, the method of manufacturing a semiconductor device of the embodiment 6 is explained in the order of these steps.

(a) Semiconductor Base Body Forming Step

Firstly, a p⁺ type diffusion layer 112 is formed by diffusion of a p type impurity from one surface of an n⁻ type semiconductor substrate (n⁻ type silicon substrate) 110, and an n⁺ type diffusion layer 114 is formed by diffusion of an n type impurity from the other surface of the n⁻ type semiconductor substrate 110 thus forming a semiconductor base body in which a pn junction arranged parallel to a main surface of the semiconductor base body is formed. Thereafter, oxide films 116, 118 are formed by thermal oxidation on a surface of the p⁺ type diffusion layer 112 and a surface of the n⁺ type diffusion layer 114 respectively (see FIG. 5A).

(b) Trench Forming Step

Next, predetermined opening portions are formed on the oxide film 116 at predetermined positions by photo etching. After etching the oxide film, subsequently, the semiconductor base body is etched thus forming trenches 120 having a depth exceeding the pn junction from one surface of the semiconductor base body (see FIG. 5B). Along with such formation of the trenches, a pn junction exposure portion A is formed on an inner surfaces of the trench.

(c) Insulation Layer Forming Step

Figure 5A:
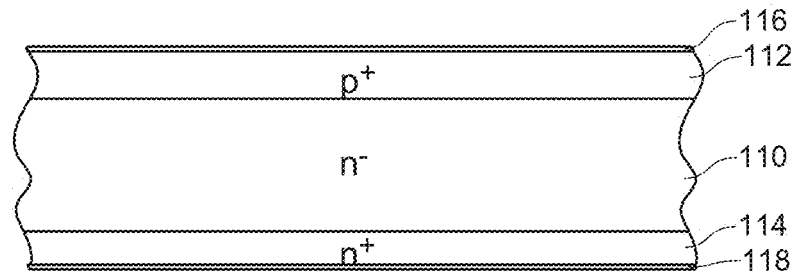
FIG. 5A to FIG. 5D are views for explaining a method of manufacturing a semiconductor device according to an embodiment 6.
Figure 5B:
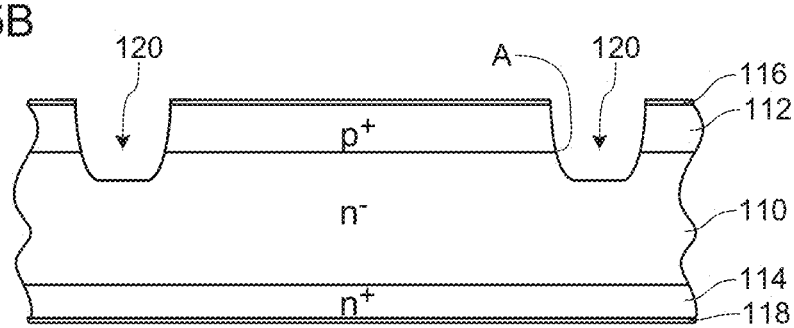
Figure 5C:
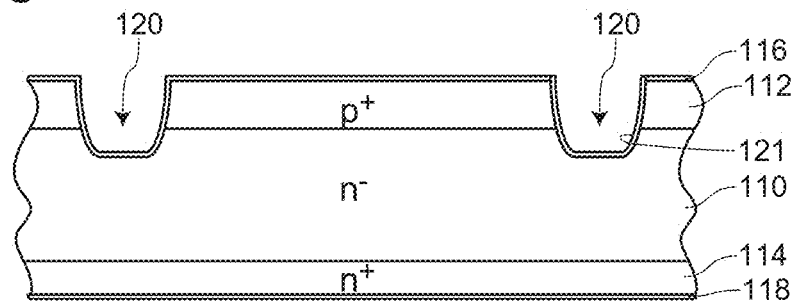

Next, an insulation layer 121 formed of a silicon oxide film is formed on inner surfaces of the trenches 120 by a thermal oxidation method using dry oxygen ($DryO_2$) (see FIG. 5C). A thickness of the insulation layer 121 is set to a value which falls within a range of 5 nm to 60 nm (20 nm, for example). The insulation layer is formed such that a semiconductor base body is introduced into a diffusion furnace and, thereafter, thermal oxidation treatment is performed at a temperature of 900° C. for 10 minutes while supplying an oxygen gas into the diffusion furnace. When the thickness of the insulation layer 121 is less than 5 nm, there may be a case where a reverse current reduction effect cannot be acquired. On the other hand, when the thickness of the insulation layer 121 exceeds 60 nm, there may be a case where a layer made of a glass composition cannot be formed by an electrophoresis method in a next glass layer forming step.

(d) Glass Layer Forming Step

Figure 5D:
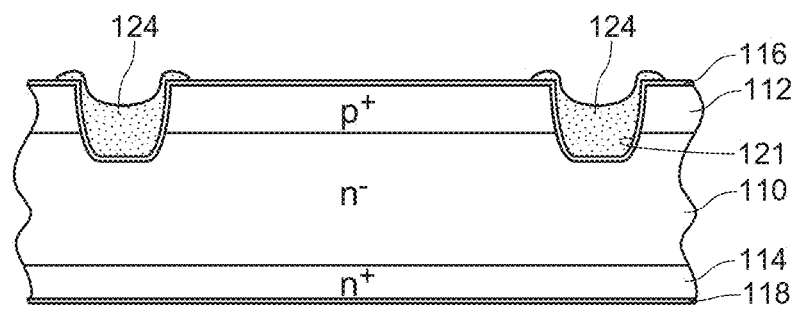

Next, a layer made of the glass composition for protecting a semiconductor junction of the embodiment 1 is formed on inner surfaces of the trenches 120 and a surface of the semiconductor base body in the vicinity of the trenches 120 by an electrophoresis method and, then, the layer made of the glass composition for protecting a semiconductor junction is baked thus forming a glass layer 124 for passivation (see FIG. 5D). In forming the layer made of the glass composition for protecting a semiconductor junction on the inner surfaces of the trenches 120, the layer made of the glass composition for protecting a semiconductor junction is formed such that the layer made of the glass composition for protecting a semiconductor junction covers the inner surfaces of the trenches 120 with an insulation layer 121 interposed therebetween. Accordingly, the pn junction exposure portion A in the trench 120 is brought into a state where the pn junction exposure portion A is covered with the glass layer 124 with the insulation layer 121 interposed therebetween.

(e) Oxide Film Removing Step

Figure 6A:
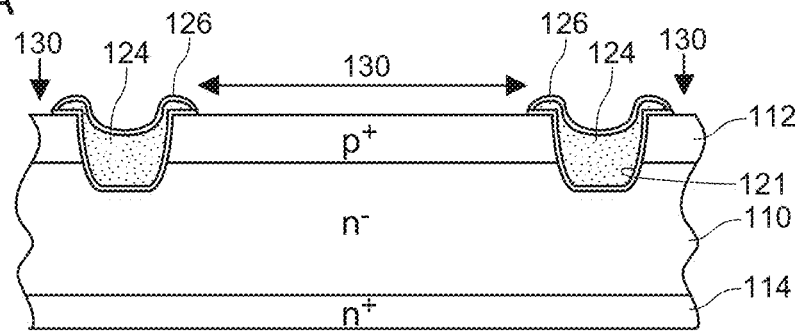
FIG. 6A to FIG. 6D are views for explaining the method of manufacturing a semiconductor device according to the embodiment 6.

Next, a photoresist 126 is formed such that the photoresist 126 covers the surface of the glass layer 124 and, thereafter, the oxide film 116 is etched using the photoresist 126 as a mask so that the oxide film 116 formed at a position 130 where an Ni plating electrode film is to be formed is removed (see FIG. 6A).

(f) Roughened Surface Region Forming Step

Figure 6B:
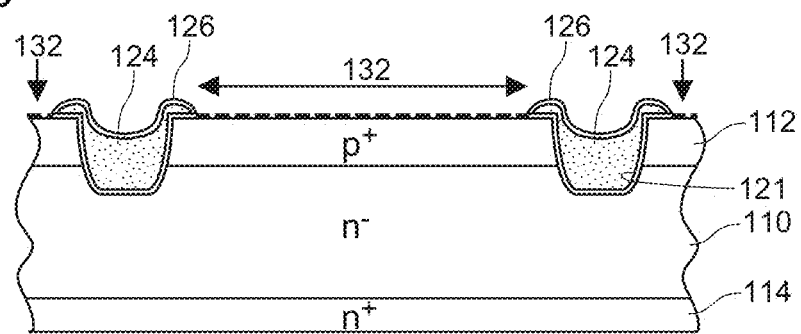

Next, a surface of the semiconductor base body at the position 130 where the Ni-plating electrode film is to be formed is subjected to surface roughening treatment thus forming a roughened surface region 132 for enhancing adhesiveness between an Ni plating electrode and the semiconductor base body (see FIG. 6B).

(g) Electrode Forming Step

Figure 6C:
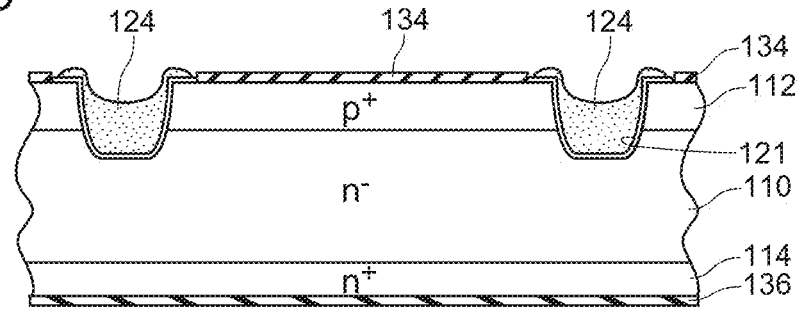

Next, Ni plating is applied to the semiconductor base body thus forming an anode electrode 134 on the roughened surface region 132 and forming a cathode electrode 136 on the other surface of the semiconductor base body (see FIG. 6C).

(h) Semiconductor Base Body Cutting Step

Figure 6D:
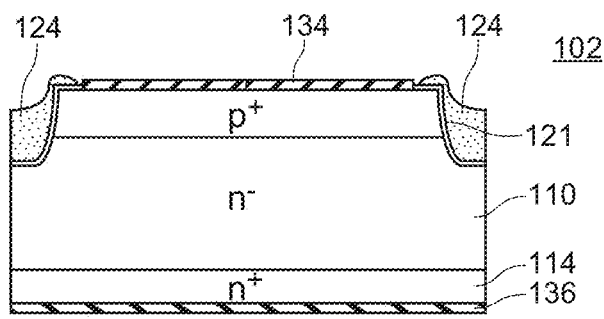

Next, the semiconductor base body is cut by dicing or the like at a center portion of each glass layer 124 thus dividing the semiconductor base body into chips whereby semiconductor devices (mesa-type pn diodes) 102 are manufactured (see FIG. 6D).

Through the above-mentioned steps, the mesa-type semiconductor device having high breakdown strength (semiconductor device of the embodiment 6) 102 can be manufactured.

Embodiment 7

In the same manner as the method of manufacturing a semiconductor device of the embodiment 5, the method of manufacturing a semiconductor device of the embodiment 7 includes, in the following order: a first step of preparing a semiconductor element which includes a pn junction exposure portion where a pn junction is exposed; and a second step of forming a glass layer such that the glass layer covers the pn junction exposure portion. In the second step, the glass layer is formed using the glass composition for protecting a semiconductor junction of the embodiment 1. However, different from the method of manufacturing a semiconductor device of the embodiment 5, in the method of manufacturing a semiconductor device of the embodiment 7, the second step includes: a step of forming an insulation layer on the pn junction exposure portion on a surface of a semiconductor base body; and a step of forming the glass layer such that the glass layer covers the pn junction exposure portion with the insulation layer interposed therebetween. In the method of manufacturing a semiconductor device of the embodiment 7, a planar-type pn diode is manufactured as the semiconductor device.

FIG. 7A to FIG. 7D and FIG. 8A to FIG. 8D are views for explaining the method of manufacturing a semiconductor device of the embodiment 7. FIG. 7A to FIG. 7D and FIG. 8A to FIG. 8D are views showing respective steps of the method of manufacturing a semiconductor device.

In the method of manufacturing a semiconductor device of the embodiment 7, as shown in FIG. 7A to FIG. 7D and FIG. 8A to FIG. 8D, "semiconductor base body preparing step", "p$^+$ type diffusion layer forming step", "n$^+$ type diffusion layer forming step", "insulation layer forming step", "glass layer forming step", "etching step", "electrode forming step" and "semiconductor base body cutting step" are performed in this order. Hereinafter, the method of manufacturing a semiconductor device of the embodiment 7 is explained in the order of these steps.

(a) Semiconductor Base Body Preparing Step

Figure 7A:
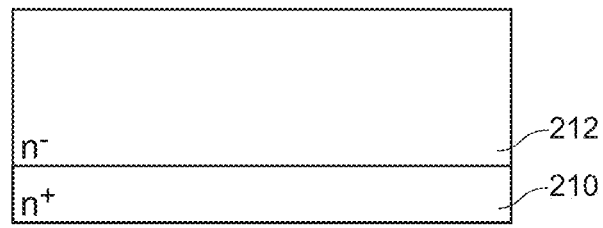
FIG. 7A to FIG. 7D are views for explaining a method of manufacturing a semiconductor device according to an embodiment
Figure 7B:
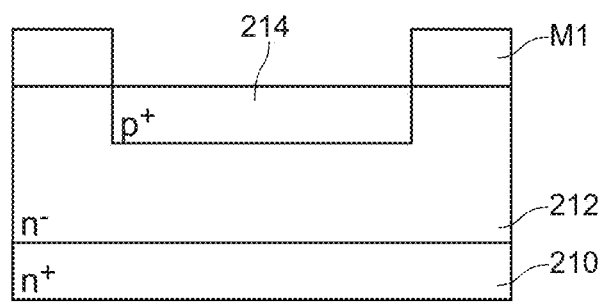
Figure 7C:
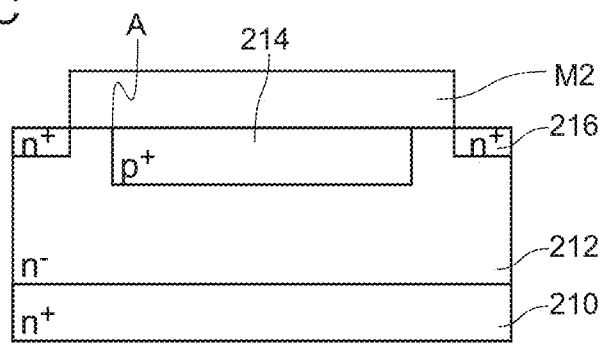
Figure 7D:
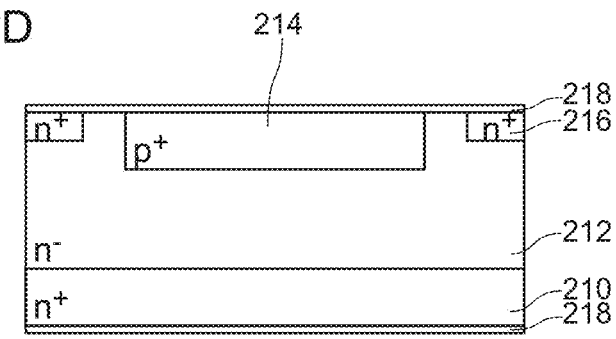

Firstly, a semiconductor base body where an n$^-$ type epitaxial layer 212 is laminated on an n' type silicon substrate 210 is prepared (see FIG. 7A).

(b) p$^-$ Type Diffusion Layer Forming Step

Next, after forming a mask M1 on the n$^-$ type epitaxial layer 212, a p type impurity (boron ion, for example) is injected into a predetermined region on a surface of the n$^-$ type epitaxial layer 212 by an ion implantation method using the mask M1. Then, a p$^+$ type diffusion layer 214 is formed by thermal diffusion (see FIG. 7B).

(c) n$^+$ Type Diffusion Layer Forming Step

Next, the mask M1 is removed from the n$^-$ type epitaxial layer 212 and a mask M2 is formed on the n$^-$ type epitaxial layer 212. Thereafter, an n type impurity (arsenic ion, for example) is injected into a predetermined region on the surface of the n$^-$ type epitaxial layer 212 by an ion implantation method using the mask M2. Then, an n$^+$ type diffusion layer 216 is formed by thermal diffusion (see FIG. 7C). In this step, a pn junction exposure portion A is formed on a surface of the semiconductor base body.

(d) Insulation Layer Forming Step

Next, the mask M2 is removed from the n$^-$ type epitaxial layer 212. Thereafter, an insulation layer 218 formed of a silicon oxide film is formed on the surface of the n$^-$ type epitaxial layer 212 (and on a back surface of the n$^+$ type silicon substrate 210) by a thermal oxidation method using dry oxygen (DryO$_2$) (see FIG. 7D). A thickness of the insulation layer 218 is set to a value which falls within a range of 5 nm to 60 nm (20 nm, for example). The insulation layer 218 is formed such that a semiconductor base body is introduced into a diffusion furnace and, thereafter, thermal oxidation treatment is applied to the semiconductor base body at a temperature of 900° C. for 10 minutes while supplying an oxygen gas into the diffusion furnace. When the thickness of the insulation layer 218 is less than 5 nm, there may be a case where a reverse current reduction effect cannot be acquired. On the other hand, when the thickness of the insulation layer 218 exceeds 60 nm, there may be a case where a layer made of the glass composition cannot be formed by an electrophoresis method in the next glass layer forming step.

(e) Glass Layer Forming Step

Figure 8A:
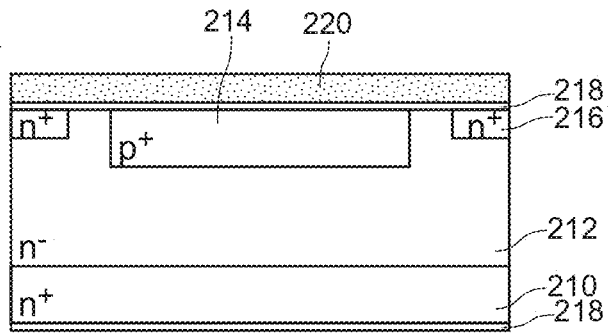
FIG. 8A to FIG. 8D are views for explaining a method of manufacturing the semiconductor device according to the embodiment 7.

Next, a layer made of the glass composition for protecting a semiconductor junction of the embodiment 1 is formed on a surface of the insulation layer 218 by an electrophoresis method and, then, the layer made of the glass composition for protecting a semiconductor junction is baked thus forming a glass layer 220 for passivation (see FIG. 8A).

(f) Etching Step

Figure 8B:
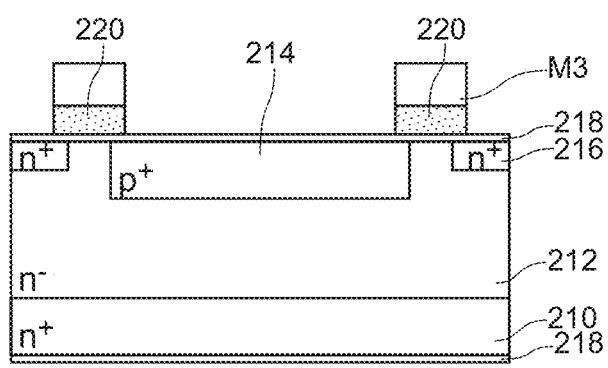
Figure 8C:
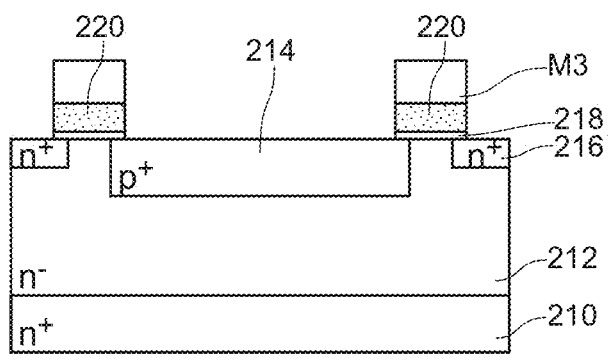

Next, after forming a mask M3 on the surface of the glass layer 220, the glass layer 220 is etched (see FIG. 8B). Subsequently, the insulation layer 218 is etched (see FIG. 8C). Due to such etching, the insulation layer 218 and the glass layer 220 are formed on a predetermined region on the surface of the n$^-$ type epitaxial layer 212.

(g) Electrode Forming Step

Figure 8D:
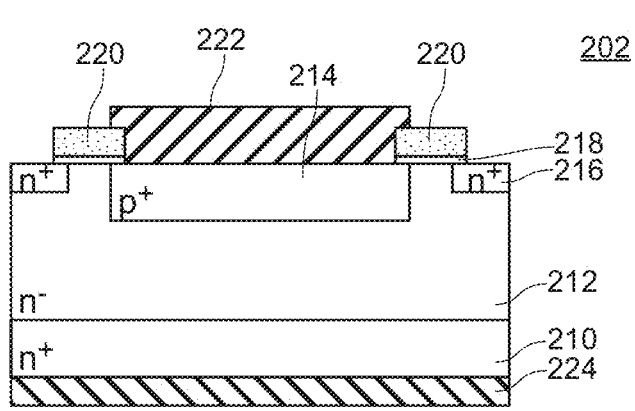

Next, the mask M3 is removed from the surface of the glass layer 220 and, thereafter, an anode electrode 222 is formed on a region of the surface of the semiconductor base body surrounded by the glass layer 220, and a cathode electrode 224 is formed on a back surface of the semiconductor base body (see FIG. 8D).

(h) Semiconductor Base Body Cutting Step

Next, the semiconductor base body is cut by dicing or the like thus dividing the semiconductor base body into chips whereby the semiconductor devices (planar-type pn diodes) 202 are manufactured (not shown in the drawing).

Through the above-mentioned steps, a planar-type semiconductor device having high breakdown strength (the semiconductor device of the embodiment 7) 202 can be manufactured.

EXAMPLES

1. Preparation of Specimens

FIG. 9 is a Table showing conditions and results of examples. Raw materials are prepared at composition ratios indicated in examples 1 to 8 and comparison examples 1 and 2 (see FIG. 9). These raw materials are sufficiently mixed and stirred together by a mixer and, thereafter, the mixed raw material is put into a platinum crucible, a temperature of the mixed raw material is elevated up to a predetermined temperature (1350° C. to 1550° C., for example) in an electric furnace and is melted for two hours. Then, the material in a molten state is made to flow out from the crucible and is fed to water-cooled rolls so that glass flakes in a flaky shape are obtained. The glass flakes are pulverized by a ball mill until the glass flakes obtain an average particle size of 5 μm thus obtaining powdery glass composition.

The raw materials used in the examples are $SiO_2$, $H_2BO_2$, $Al_2O_2$, ZnO, $CaCO_3$, MgO, $BaCO_3$, NiO, $ZrO_2$ and PbO.

2. Evaluation

The respective glass compositions obtained by the above-mentioned methods are evaluated in accordance with the following evaluation aspects.
(1) Evaluation Aspect 1 (Environmental Burden)

The object of the present invention lies in that "a semiconductor device having high breakdown strength can be manufactured by using a glass material which contains no lead in the same manner as the conventional case where "a glass material containing lead silicate as a main component" is used" and hence, the score "good" is given when the glass composition contains no lead component, and the score "bad" is given when the glass composition contains a lead component.
(2) Evaluation Aspect 2 (Baking Temperature)

When the baking temperature is excessively high, the baking temperature largely influences a semiconductor device in a manufacturing process. Accordingly, the score "good" is given when the baking temperature is equal to or below 900° C., and the score "bad" is given when the baking temperature exceeds 900° C.
(3) Evaluation Aspect 3 (Resistance to Chemicals)

The score "good" is given when the glass composition exhibits insolubility with respect to both aqua regia and plating liquid, and the score "bad" is given when the glass composition exhibits solubility to at least one of aqua regia and plating liquid.
(4) Evaluation Aspect 4 (Average Linear Expansion Coefficient)

Glass plates in a flaky shape are prepared from a material in a molten state obtained in the above-mentioned "1. Preparation of specimens", and an average linear expansion coefficient of the glass composition at a temperature of 50° C. to 550° C. is measured by using the glass plates in a flaky shape. The average linear expansion coefficient is measured by a total expansion measuring method (temperature elevation speed: 10° C./min) using Thermomechanical Analyzers TMA-60 made by SHIMADZU CORP where silicon single crystal having a length of 20 mm is used as a standard specimen.

Figure 10A:
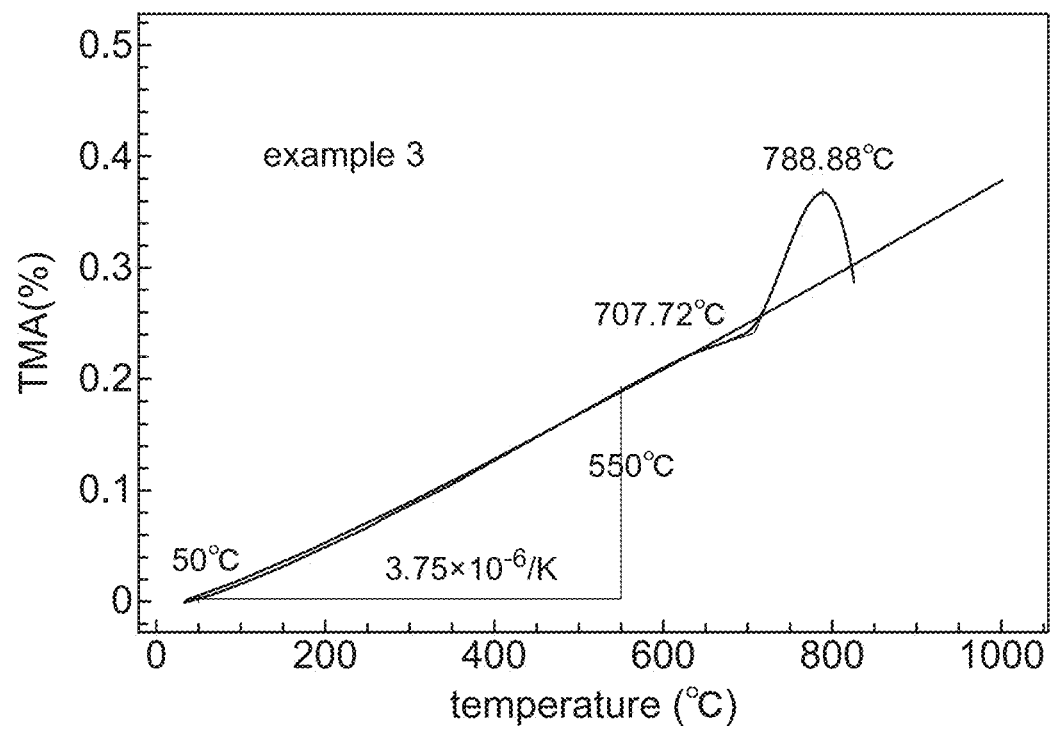
FIG. 10A and FIG. 10B are graphs showing one example of a result of measurement of linear expansion coefficients.
Figure 10B:
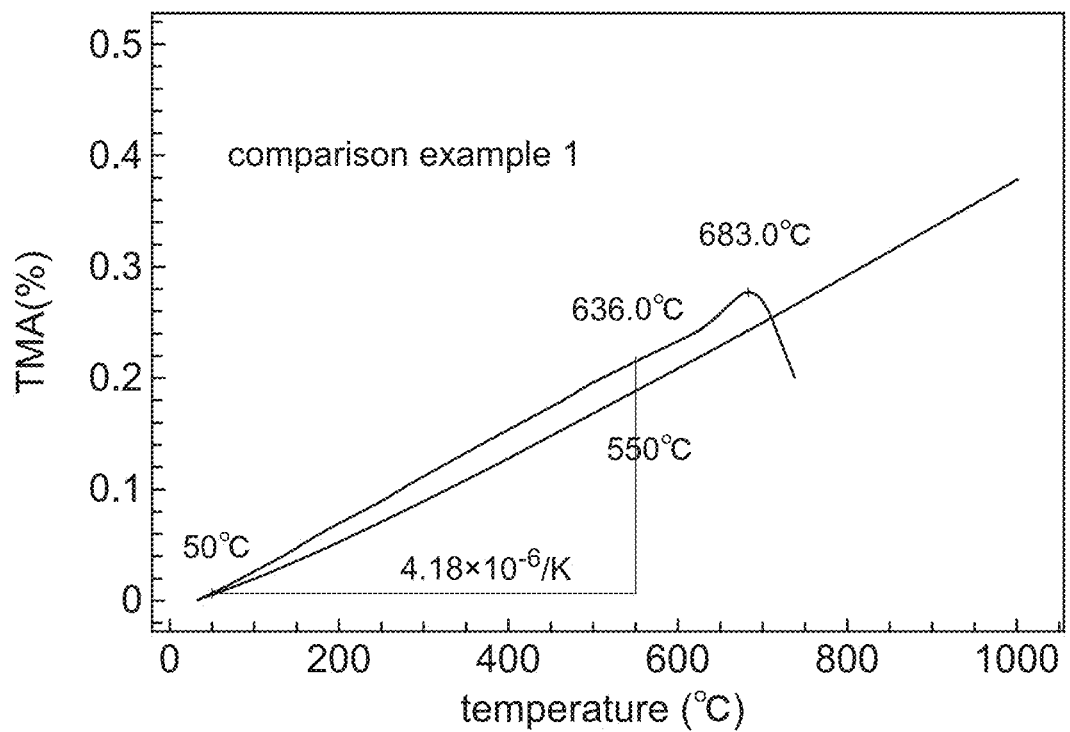

FIG. 10A and FIG. 10B are graphs showing one example of the result of measurement of an average linear expansion coefficient, wherein FIG. 10A is a graph showing the measurement result of the glass composition for protecting a semiconductor junction according to the example 3, and FIG. 10B is a graph showing the measurement result of the glass composition for protecting a semiconductor junction according to the comparison example 1. The score "good" is given when a difference between the average linear expansion coefficient of the glass composition at a temperature of 50° C. to 550° C. and a linear expansion coefficient ($3.73 \times 10^{-6}$) of silicon is "$0.4 \times 10^{-6}$" or less, and the score "bad" is given when the difference exceeds "$0.4 \times 10^{-6}$". In the column of the evaluation aspect 4 in FIG. 9, numerals in parentheses indicate average linear expansion coefficient of the glass composition within a temperature range of 50° C. to 550° C. $\times 10^{+6}$.

(5) Evaluation Aspect 5 (Insulation Property)

A semiconductor device (pn diodes) is manufactured by a method substantially equal to the method of manufacturing a semiconductor device of the embodiment 4 or 6, and a reverse breakdown voltage characteristic of a semiconductor device manufactured by the method is measured. In examples 7 and 8 and comparison examples 1 and 2, a semiconductor device is manufactured by the method of manufacturing a semiconductor device of the embodiment 4. In examples 1 to 6, a semiconductor device is manufactured by the method of manufacturing a semiconductor device of the embodiment 6. As the result of the measurement, the score "good" is given when a reverse breakdown voltage characteristic of a semiconductor device falls within a normal range, and the score "bad" is given when a reverse breakdown voltage characteristic of a semiconductor device falls outside a normal range.
(6) Evaluation Aspect 6 (Presence or Non-Presence of Crystallization)

A semiconductor device (pn diodes) is manufactured by a method substantially equal to the method of manufacturing a semiconductor device of the embodiment 4 or 6. In the examples 7 and 8 and the comparison examples 1 and 2, a semiconductor device is manufactured by the method of manufacturing a semiconductor device of the embodiment 4. In the examples 1 to 6, a semiconductor device is manufactured by the method of manufacturing a semiconductor device of the embodiment 6. As the result, the score "good" is given when vitrification can be performed without causing the crystallization in the process of vitrification of a layer made of the glass composition, and the score "bad" is given when vitrification cannot be performed due to the crystallization.
(7) Evaluation Aspect 7 (Presence or Non-Presence of Generation of Bubbles)

A semiconductor device (pn diodes) is manufactured by a method substantially equal to the method of manufacturing a semiconductor device of the embodiment 4 or 6, and the observation is made whether or not bubbles are generated in the inside of the glass layer 124 (particularly, in the vicinity of an interface between the glass layer 124 and the silicon substrate) in the course of vitrification (preliminary evaluation). Further, the glass compositions for protecting a semiconductor junction according to the examples 1 to 6 and the comparison examples 1 and 2 are applied to silicon substrates each having a size of 10 mm×10 mm by coating respectively thus forming layers made of the glass composition for protecting a semiconductor junction on the silicon substrates, and the layers made of the glass composition for protecting a semiconductor junction are baked thus forming glass layers. Then, the observation is made whether or not bubbles are generated in the inside of the glass layers (particularly, in the vicinity of an interface between the glass layer and the semiconductor base body) (subsequent evaluation). In the examples 7 and 8 and the comparison examples 1 and 2, a semiconductor device is manufactured by the method of manufacturing a semiconductor device of the embodiment 4. In the examples 1 to 6, a semiconductor device is manufactured by the method of manufacturing a semiconductor device of the embodiment 6.

Figure 11A:
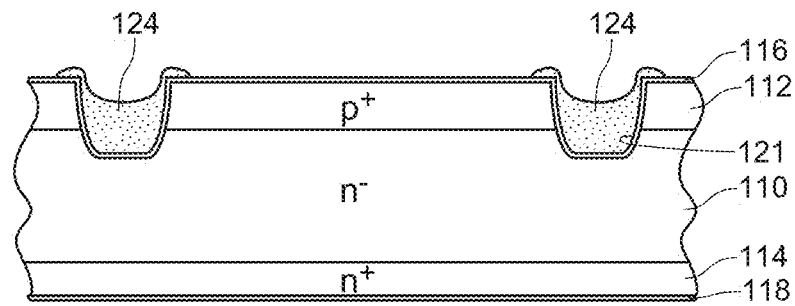
FIG. 11A and FIG. 11B are views for explaining bubbles generated in the inside of a glass layer in a preliminary evaluation.
Figure 11B:
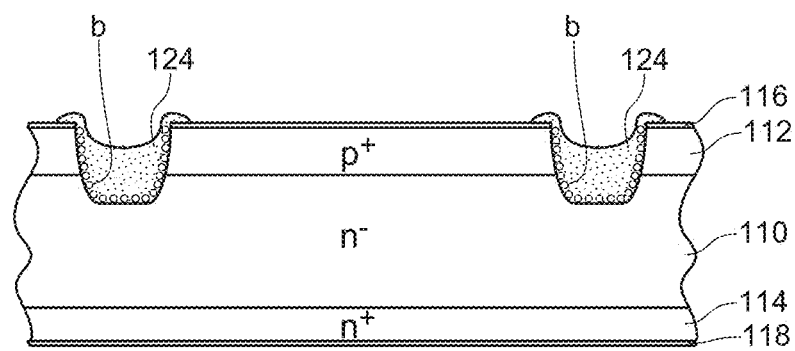
Figure 12A:
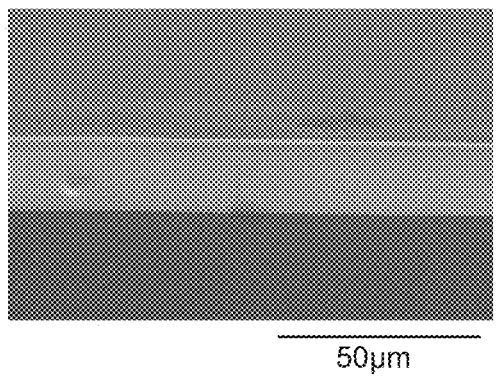
FIG. 12A and FIG. 12B are photographs for explaining bubbles generated in the inside of the glass layer in a subsequent evaluation.
Figure 12B:
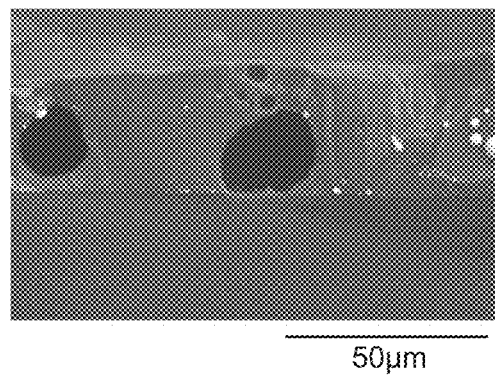
Figure 14A:
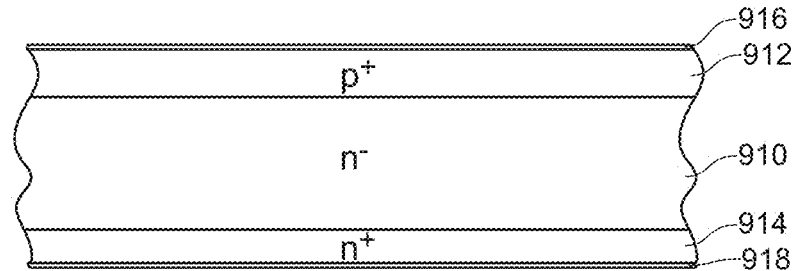
FIG. 14A to FIG. 14D are views for explaining a conventional method of manufacturing a semiconductor device.
Figure 14B:
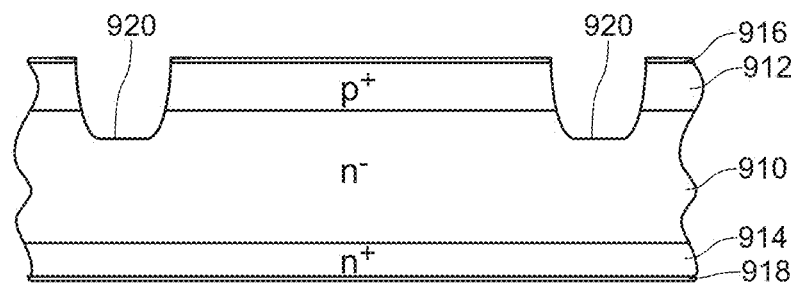
Figure 14C:
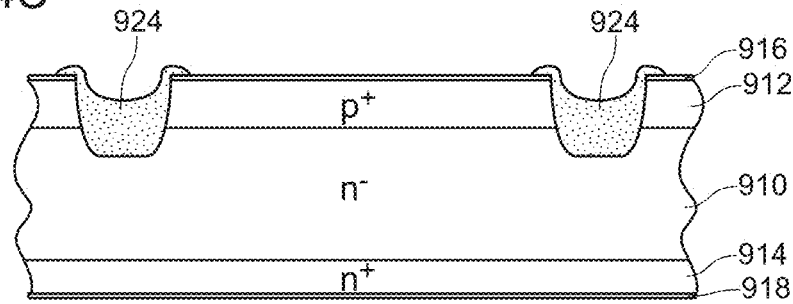
Figure 14D:
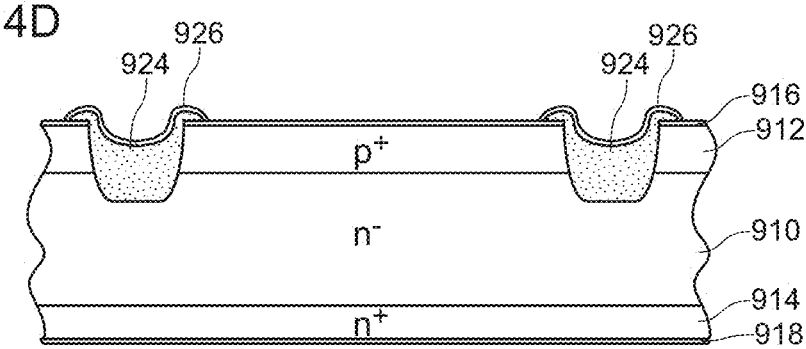
Figure 15A:
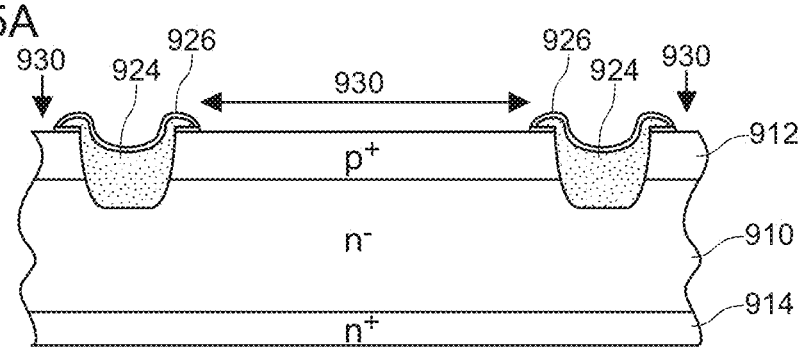
FIG. 15A to FIG. 15D are views for explaining a conventional method of manufacturing a semiconductor device.
Figure 15B:
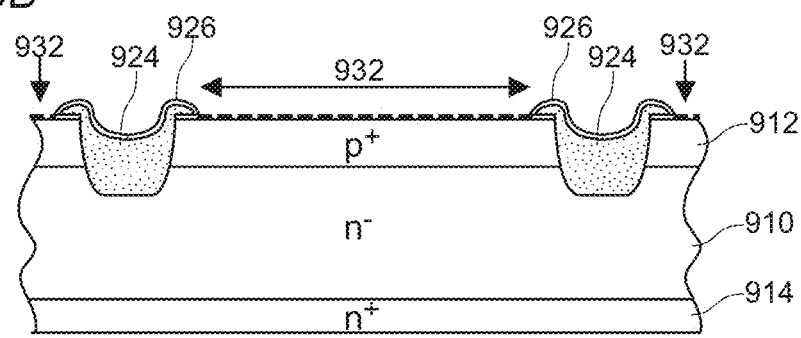
Figure 15C:
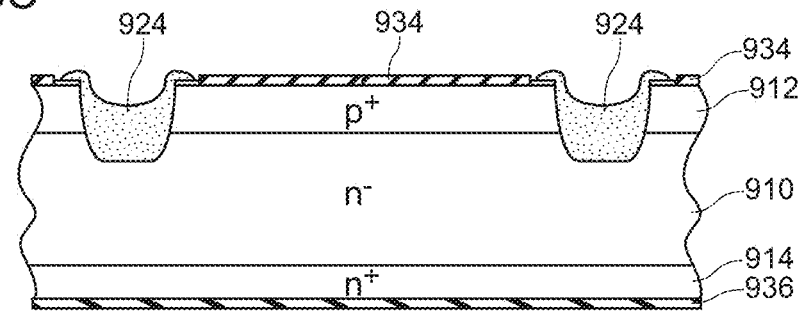
Figure 15D:
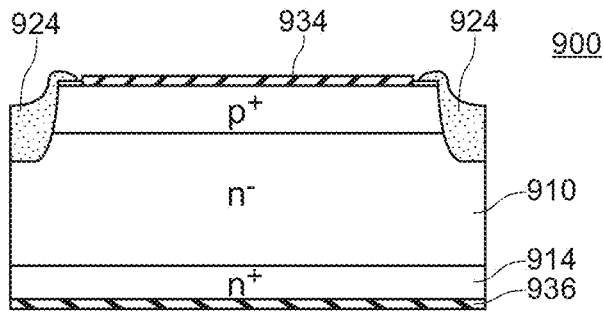

FIG. 11A and FIG. 11B are views for explaining bubbles b generated in the inside of the glass layer 124 in the preliminary evaluation. FIG. 11A is a cross-sectional view of a semiconductor device where no bubbles b are generated, while FIG. 11B is a cross-sectional view of a semiconductor device where bubbles b are generated. FIG. 12A and FIG. 12B are photographs for explaining bubbles b generated in the inside of the glass layer 124 in the subsequent evaluation.

FIG. 12A is a photograph showing an interface between the silicon substrate and the glass layer where no bubbles b are generated in an enlarged manner, and FIG. 12B is a photograph showing an interface between the silicon substrate and the glass layer where bubbles b are generated in an enlarged manner. As the result of the experiment, it is found that there is enough correlation between the result of the preliminary evaluation of the present invention and the result of the subsequent evaluation of the present invention. In the subsequent evaluation, the score "good" is given when no bubbles having a diameter of 50 µm or more are generated in the inside of the glass layer, the score "fair" is given when one to twenty bubbles having a diameter of 50 µm or more are generated in the inside of the glass layer, and the score "bad" is given when twenty one or more bubbles having a diameter of 50 µm or more are generated in the inside of the glass layer.

(8) Comprehensive Evaluation

The score "good" is given when the score "good" is given with respect to all of the above-mentioned evaluation aspects 1 to 7, and the score "bad" is given when the score "fair" or "bad" is given with respect to at least one of the respective evaluation aspects.

3. Evaluation Result

As can be understood also from FIG. 9, in all glass compositions according to the comparison examples 1 and 2, the score "bad" is given with respect to at least one of the evaluation aspects so that the score "bad" is given with respect to the comprehensive evaluation. That is, in the glass compositions according to the comparison example 1, the score "bad" is given with respect to the evaluation aspects 1 and 4. Further, in the glass composition according to the comparison example 2, the score "bad" is given with respect to the evaluation aspects 3 and 4.

To the contrary, in all glass compositions according to the examples 1 to 8, the score "good" is given with respect to all evaluation aspects (evaluation aspects 1 to 7). As the result, it is found that, although all glass compositions according to the examples 1 to 8 are a glass material which contains no lead, these glass compositions satisfy all the following conditions (a) to (d), that is, the condition (a) that the glass composition can be baked at a proper temperature (for example, 900° C. or below), the condition (b) that the glass composition withstands chemicals used in steps, the condition (c) that the glass composition has a linear expansion coefficient close to a linear expansion coefficient of silicon (particularly an average linear expansion coefficient at a temperature of 50° C. to 550° C. being close to a linear expansion coefficient of silicon), and the condition (d) that the glass composition has excellent insulation property. It is also found that these glass compositions satisfy the condition (e) that the glass composition is not crystallized in the process of vitrification, and the condition (f) that the occurrence of a state that a reverse breakdown voltage characteristic of the semiconductor device is deteriorated can be suppressed by suppressing the generation of bubbles which may be generated from an interface between the glass layer and the silicon substrate in the process of forming the glass layer.

From other experiments which the inventors carried out, it is also found that the semiconductor devices according to the examples 1 to 6 are the semiconductor devices which exhibit a low reverse current irrespective of the composition of the glass layer or a baking condition of the glass layer compared to the semiconductor devices according to the examples 7 and 8.

Also from other experiments which the inventors carried out, it is also found that bubbles are hardly generated from an interface between the silicon substrate and the glass layer in the process of forming the glass layer by baking the layer made of the glass composition in the semiconductor devices according to the examples 1 to 6 compared to the semiconductor devices according to the examples 7 and 8.

Also from other experiments which the inventors carried out, it is found that when a resin-sealed semiconductor device is manufactured by molding a semiconductor device according to the examples 1 to 8 with a resin, such a resin-sealed semiconductor device exhibits higher resistance to a reverse bias at a high temperature than a resin-sealed semiconductor device which is manufactured by molding a semiconductor device according to the comparison example 1 with a resin.

[Preliminary Evaluation]

In deciding the composition of the above-mentioned examples 1 to 8, the preliminary evaluation is carried out at 18 levels, and the result of the preliminary experiment is used as the reference. FIG. 13 is a Table showing the compositions at 18 levels and the result of the preliminary evaluation. The following matters (1) to (4) can be understood from FIG. 13.

(1) From a viewpoint of difficulty in crystallization in the process of vitrification, the smaller a total content of the content of $SiO_2$ and the content of $B_2O_3$, the more difficult the crystallization becomes. The larger the content of $Al_2O_3$, the more difficult the crystallization becomes. The smaller the content of ZnO, the more difficult the crystallization becomes. The larger the content of oxide of alkaline earth metal, the more difficult the crystallization becomes.

(2) From a viewpoint of an average linear expansion coefficient α within a temperature range of 50° C. to 550° C., the followings tendencies are found. That is, the larger a total content of the content of $SiO_2$ and the content of $B_2O_3$, the smaller the average linear expansion coefficient α becomes. The larger the content of $Al_2O_3$, the smaller the average linear expansion coefficient α becomes. With respect to ZnO, it is found that there is a tendency that the larger the content of ZnO, the smaller the average linear expansion coefficient α becomes. However, such a tendency is brought about by the decrease of the average linear expansion coefficient α caused by the crystallization and hence, it is considered desirable to set the content of ZnO small from a viewpoint of vitrification.

(3) From a viewpoint of a glass transition temperature Tg, the followings tendencies are found. That is, the smaller a total content of the content of $SiO_2$ and the content of $B_2O_2$, the lower the glass transition temperature Tg becomes. The larger a ratio of the content of $B_2O_3$ with respect to the content of $SiO_2$, the lower the glass transition temperature Tg becomes. The smaller the content of $Al_2O_3$, the lower the glass transition temperature Tg becomes. The larger the content of ZnO, the lower the glass transition temperature Tg becomes.

(4) From a viewpoint of a yield point (softening point) Ts, the followings tendencies are found. That is, the smaller a total content of the content of $SiO_2$ and the content of $B_2O_2$, the lower the yield point Ts becomes. The larger a ratio of the content of $B_2O_3$ with respect to the content of $SiO_2$, the lower the yield point Ts becomes. The larger the content of BaO, the lower the yield point Ts becomes.

Although the glass composition for protecting a semiconductor junction, the method of manufacturing a semiconductor device and such a semiconductor device according to the present invention have been explained heretofore in conjunction with the above-mentioned embodiments, the present invention is not limited to the above-mentioned embodiments, and can be carried out without departing from the gist of the present invention. For example, the following modifications are conceivable.

(1) In the above-mentioned embodiment 3, the glass composition for protecting a semiconductor junction of the present invention has been explained by using the glass composition which basically has the substantially same composition as the glass composition for protecting a semiconductor junction of the embodiment 1 as a base and contains no nickel oxide. However, the present invention is not limited to such glass composition. For example, the present invention also includes the glass composition for protecting a semiconductor junction which basically has the substantially same composition as the glass composition for protecting a semiconductor junction of the embodiment 2 as a base and contains no nickel oxide.

(2) In the above-mentioned embodiments 1 and 2, although nickel oxide is used as "at least one metal oxide selected from a group consisting of nickel oxide, copper oxide, manganese oxide and zirconium oxide (metal oxide having property of suppressing the generation of bubbles in the process of vitrification)", the present invention is not limited to nickel oxide. For example, in place of nickel oxide, copper oxide, manganese oxide or zirconium oxide may be used.

Although the present invention relates to "the glass composition for protecting a semiconductor junction which substantially contains none of Pb, As, Sb, Li, Na and K", the present invention also includes "the glass composition for protecting a semiconductor junction which substantially contains none of Pb, P, As, Sb, Li, Na and K".

(4) In the above-mentioned embodiments 4 to 7, although the glass layer is formed using the glass composition for protecting a semiconductor junction of the embodiment 1, the present invention is not limited to such glass composition. For example, the glass layer may be formed using the glass composition for protecting a semiconductor junction of the embodiment 2 or 3. Further, the glass layer may be formed using other glass compositions for protecting a semiconductor junction which fall within the scope of claim 1 or 3.

(5) In the above-mentioned respective embodiments, the present invention has been explained by taking diodes (mesa-type pn diode, planar-type pn diode) as an example. However, the present invention is not limited to such diodes. The present invention is also applicable to all types of semiconductor devices where a pn junction is exposed (for example, thyristor, power MOSFET, IGBT and the like).

EXPLANATION OF SYMBOLS

100, 102, 200, 202, 900: semiconductor device
110, 910: $n^-$ type semiconductor substrate
112, 912: $p^+$ type diffusion layer
114, 214, 914: $n^-$ type diffusion layer
116, 118, 916, 918: oxide film
120, 920: trench
121, 218: insulation layer
124, 215, 217, 220, 924: glass layer
126, 926: photoresist
130, 930: portion where Ni-plating electrode film is to be formed
132, 932: roughened surface region
134, 934: anode electrode
136, 936: cathode electrode
210: $n^+$ type semiconductor substrate
212: $n^-$ type epitaxial layer
216: $n^+$ type diffusion layer
222: anode electrode layer
224: cathode electrode layer
b: bubbles

The invention claimed is:

1. A glass composition for protecting a semiconductor junction which is used for forming a glass layer to cover a pn junction exposure portion of a silicon-made semiconductor element having the pn junction exposure portion where a pn junction is exposed, the glass composition comprising:
fine glass particles prepared from a material in a molten state obtained by melting a glass material which contains at least $SiO_2$, $B_2O_3$, $Al_2O_3$, ZnO, and at least two oxides of alkaline earth metals selected from the group consisting of CaO, MgO and BaO, and substantially contains none of Pb, As, Sb, Li, Na and K, wherein
the glass composition further contains nickel oxide,
the content of $SiO_2$ falls within a range of 49.5 mol % to 64.3 mol %,
the content of $B_2O_3$ falls within a range of 8.4 mol % to 17.9 mol %,
the content of $Al_2O_3$ falls within a range of 3.7 mol % to 14.8 mol %,
the content of ZnO falls within a range of 3.9 mol % to 14.2 mol %, and
the content of the oxides of alkaline earth metals falls within a range of 7.4 mol % to 12.9 mol %, and
an average linear expansion coefficient within a temperature range of 50° C. to 550° C. falls within a range of $3.33 \times 10^{-6}$ to $4.13 \times 10^{-6}$.

2. The glass composition according to claim 1, wherein the average linear expansion coefficient within the temperature range of 50° C. to 550° C. falls within a range of $3.38 \times 10^{-6}$ to $4.08 \times 10^{-6}$.

3. The glass composition according to claim 1, wherein a total content of the content of $SiO_2$ and the content of $B_2O_3$ falls within a range of 65 mol % to 75 mol %.

4. The glass composition according to claim 1, wherein the glass composition contains, as the oxides of alkaline earth metals, all of CaO, MgO and BaO.

5. The glass composition according to claim 4, wherein the content of CaO falls within a range of 2.0 mol % to 5.3 mol %,
the content of MgO falls within a range of 1.0 mol % to 2.3 mol %, and
the content of BaO falls within a range of 2.6 mol % to 5.3 mol %.

6. The glass composition according to claim 1, wherein the glass composition contains, as the oxides of alkaline earth metals, CaO and BaO.

7. The glass composition for according to claim 6, wherein out of the oxides of alkaline earth metals,
the content of CaO falls within a range of 2.0 mol % to 7.6 mol %, and
the content of BaO falls within a range of 3.7 mol % to 5.9 mol %.

8. The glass composition according to claim 1, wherein the glass composition further contains at least one metal oxide selected from the group consisting of nickel oxide, copper oxide, manganese oxide and zirconium oxide.

9. The glass composition according to claim 8, wherein the content of the at least one metal oxide falls within a range of 0.01 mol % to 2.0 mol %.

10. A method of manufacturing a semiconductor device comprising, in the following order:
- a first step of preparing a silicon-made semiconductor element having a pn junction exposure portion where a pn junction is exposed; and
- a second step of forming a glass layer by forming a layer made of a glass composition for protecting a semiconductor junction such that the layer covers the pn junction exposure portion and by baking the layer made of the glass composition for protecting a semiconductor junction, wherein
- in the second step, the glass layer is formed using the glass composition for protecting a semiconductor junction which is made of fine glass particles prepared from a material in a molten state obtained by melting a glass material which contains at least $SiO_2$, $B_2O_3$, $Al_2O_3$, ZnO and at least two oxides of alkaline earth metals selected from a group consisting of CaO, MgO and BaO, and substantially contains none of Pb, As, Sb, Li, Na and K, wherein the glass composition further contains nickel oxide, the content of $SiO_2$ falls within a range of 49.5 mol % to 64.3 mol %, the content of $B_2O_3$ falls within a range of 8.4 mol % to 17.9 mol %, the content of $Al_2O_3$ falls within a range of 3.7 mol % to 14.8 mol %, the content of ZnO falls within a range of 3.9 mol % to 14.2 mol %, and the content of the oxide of alkaline earth metal falls within a range of 7.4 mol % to 12.9 mol %, and an average linear expansion coefficient within a temperature range of 50° C. to 550° C. falls within a range of $3.33 \times 10^{-6}$ to $4.13 \times 10^{-6}$.

11. The method of manufacturing a semiconductor device according to claim 10, wherein
the first step includes:
- a step of preparing a semiconductor base body having a pn junction parallel to a main surface; and
- a step of forming the pn junction exposure portion in the inside of a trench by forming the trench from one surface of the semiconductor base body with a depth exceeding the pn junction, and the second step includes a step of forming the glass layer such that the glass layer covers the pn junction exposure portion in the inside of the trench.

12. The method of manufacturing a semiconductor device according to claim 11, wherein the second step includes a step of forming the glass layer such that the glass layer directly covers the pn junction exposure portion in the trench.

13. The method of manufacturing a semiconductor device according to claim 11, wherein the second step includes
- a step of forming an insulation layer over the pn junction exposure portion in the trench, and
- a step of forming the glass layer such that the glass layer covers the pn junction exposure portion with the insulation layer interposed therebetween.

14. The method of manufacturing a semiconductor device according to claim 10, wherein
the first step includes a step of forming the pn junction exposure portion on a surface of a semiconductor base body, and the second step includes a step of forming the glass layer such that the glass layer covers the pn junction exposure portion on the surface of the semiconductor base body.

15. The method of manufacturing a semiconductor device according to claim 14, wherein the second step includes a step of forming the glass layer such that the glass layer directly covers the pn junction exposure portion on the surface of the semiconductor base body.

16. The method of manufacturing a semiconductor device according to claim 14, wherein the second step includes
- a step of forming an insulation layer on the pn junction exposure portion on a surface of the semiconductor base body, and
- a step of forming the glass layer such that the glass layer covers the pn junction exposure portion with the insulation layer interposed therebetween.

17. A semiconductor device comprising:
- a silicon-made semiconductor element having a pn junction exposure portion where a pn junction is exposed; and
- a glass layer which is formed by forming a layer made of a glass composition for protecting a semiconductor junction such that the layer covers the pn junction exposure portion and by baking the layer made of the glass composition for protecting a semiconductor junction, wherein
- the glass layer is formed using the glass composition for protecting a semiconductor junction which is made of fine glass particles prepared from a material in a molten state obtained by melting a glass material which contains at least $SiO_2$, $B_2O_3$, $Al_2O_3$, ZnO and at least two oxides of alkaline earth metals selected from a group consisting of CaO, MgO and BaO, and substantially contains none of Pb, As, Sb, Li, Na and K, wherein the glass composition further contains nickel oxide, the content of $SiO_2$ falls within a range of 49.5 mol % to 64.3 mol %, the content of $B_2O_3$ falls within a range of 8.4 mol % to 17.9 mol %, the content of $Al_2O_3$ falls within a range of 3.7 mol % to 14.8 mol %, the content of ZnO falls within a range of 3.9 mol % to 14.2 mol %, and the content of the oxide of alkaline earth metal falls within a range of 7.4 mol % to 12.9 mol %, and an average linear expansion coefficient within a temperature range of 50° C. to 550° C. falls within a range of $3.33 \times 10^{-6}$ to $4.13 \times 10^{-6}$.

18. The glass composition according to claim 1, wherein the glass composition is configured to form the glass layer without causing crystallization in forming the glass layer by baking the glass composition.

19. The method of manufacturing a semiconductor device according to claim 10, wherein in the second step, the glass layer is formed without causing crystallization by baking the layer made of the glass composition for protecting a semiconductor junction.

20. The semiconductor device according to claim 17, wherein the glass layer is a layer formed by baking the glass composition for protecting a semiconductor junction without causing crystallization.

* * * * *